United States Patent
Kijima et al.

(10) Patent No.: US 11,785,854 B2
(45) Date of Patent: Oct. 10, 2023

(54) FILM STRUCTURE AND METHOD FOR MANUFACTURING THE SAME

(71) Applicant: I-PEX PIEZO SOLUTIONS INC., Yamaguchi (JP)

(72) Inventors: Takeshi Kijima, Yamaguchi (JP); Yasuaki Hamada, Yamaguchi (JP)

(73) Assignee: I-PEX PIEZO SOLUTIONS INC., Yamaguchi (JP)

( * ) Notice: Subject to any disclaimer, the term of this patent is extended or adjusted under 35 U.S.C. 154(b) by 232 days.

(21) Appl. No.: 16/762,212

(22) PCT Filed: Nov. 9, 2018

(86) PCT No.: PCT/JP2018/041647
§ 371 (c)(1),
(2) Date: May 7, 2020

(87) PCT Pub. No.: WO2019/093471
PCT Pub. Date: May 16, 2019

(65) Prior Publication Data
US 2020/0357978 A1    Nov. 12, 2020

(30) Foreign Application Priority Data
Nov. 13, 2017  (JP) .................. 2017-218134

(51) Int. Cl.
*H01L 41/319*    (2013.01)
*H01L 41/187*    (2006.01)
(Continued)

(52) U.S. Cl.
CPC .......... *H10N 30/079* (2023.02); *C23C 14/08* (2013.01); *C23C 14/082* (2013.01);
(Continued)

(58) Field of Classification Search
CPC ... H01L 41/047; H01L 41/316; H01L 41/318; H01L 41/319; H01L 41/1876;
(Continued)

(56) References Cited

U.S. PATENT DOCUMENTS 5,656,382 A * 8/1997 Nashimoto ............. H01L 28/24
                                                   428/629
5,919,515 A    7/1999 Yano et al.
(Continued)

FOREIGN PATENT DOCUMENTS

EP    1 054 460    11/2000
JP    11-312801    11/1999
(Continued)

OTHER PUBLICATIONS

S. Yoshida et al., "Fabrication and characterization of large figure-of-merit epitaxial PMnN-PZT/ Si transducer for piezoelectric MEMS sensors", Sensors and Actuators A 239, pp. 201-208, 2016, cited in the specification.
(Continued)

*Primary Examiner* — Shawki S Ismail
*Assistant Examiner* — Monica Mata
(74) *Attorney, Agent, or Firm* — Wenderoth, Lind & Ponack, L.L.P.

(57) ABSTRACT

A film structure includes a substrate (11) which is a silicon substrate including an upper surface (11*a*) composed of a (100) plane, an alignment film (12) which is formed on the upper surface (11*a*) and includes a zirconium oxide film which has a cubic crystal structure and is (100)-oriented, and a conductive film (13) which is formed on the alignment film (12) and includes a platinum film which has a cubic crystal structure and is (100)-oriented. An average interface roughness of an interface (IF1) between the alignment film (12) and the conductive film (13) is greater than an average
(Continued)

interface roughness of an interface (IF2) between the substrate (11) and the alignment film (12).

18 Claims, 34 Drawing Sheets

(51) Int. Cl.
| | |
|---|---|
| *C23C 14/35* | (2006.01) |
| *C23C 14/16* | (2006.01) |
| *C23C 14/30* | (2006.01) |
| *C23C 14/08* | (2006.01) |
| *H10N 30/079* | (2023.01) |
| *H10N 30/87* | (2023.01) |
| *H10N 30/853* | (2023.01) |
| H10N 30/076 | (2023.01) |
| H10N 30/078 | (2023.01) |

(52) U.S. Cl.
CPC ............ *C23C 14/083* (2013.01); *C23C 14/16* (2013.01); *C23C 14/30* (2013.01); *C23C 14/35* (2013.01); *H10N 30/8554* (2023.02); *H10N 30/87* (2023.02); *H10N 30/076* (2023.02); *H10N 30/078* (2023.02)

(58) Field of Classification Search
CPC ......... C23C 14/08; C23C 14/16; C23C 14/30; C23C 14/35; C23C 14/082; C23C 14/083; H10N 30/076; H10N 30/078; H10N 30/079; H10N 30/87; H10N 30/8554
USPC ........................................................ 310/364
See application file for complete search history.

(56) References Cited

U.S. PATENT DOCUMENTS

| | | | |
|---|---|---|---|
| 6,198,208 B1 | 3/2001 | Yano et al. | |
| 6,258,459 B1 | 7/2001 | Noguchi et al. | |
| 2002/0006733 A1 | 1/2002 | Noguchi et al. | |
| 2006/0170736 A1* | 8/2006 | Tomozawa | H01L 41/316 347/71 |
| 2008/0088207 A1 | 4/2008 | Li | |
| 2014/0225226 A1* | 8/2014 | Srinivasan | H01L 21/02197 257/532 |
| 2015/0183190 A1 | 7/2015 | Kijima et al. | |
| 2016/0005950 A1* | 1/2016 | Itayama | H01L 41/1876 347/68 |
| 2016/0049577 A1 | 2/2016 | Kijima | |
| 2017/0158571 A1 | 6/2017 | Kijima | |
| 2017/0179367 A1 | 6/2017 | Kijima et al. | |

FOREIGN PATENT DOCUMENTS

| | | |
|---|---|---|
| JP | 2001-313429 | 11/2001 |
| JP | 2002-164586 | 6/2002 |
| JP | 2007-36612 | 2/2007 |
| JP | 2007-266566 | 10/2007 |
| JP | 2008-98381 | 4/2008 |
| JP | 2014-84494 | 5/2014 |
| JP | 2015-128089 | 7/2015 |
| JP | 6498821 | 3/2019 |
| TW | 201724589 | 7/2017 |
| WO | 2016/009698 | 1/2016 |
| WO | 2017/002738 | 1/2017 |

OTHER PUBLICATIONS

M. Kobune et al., "Growth and Characterization of Lead Titanate Single Crystals Grown in a Magnesia Single Crystal Crucible", Yogyo-Kyokai-Shi, vol. 95, No. 11, pp. 1053-1058, 1987, cited in the specification.
International Search Report (ISR) dated Jan. 22, 2019 in International (PCT) Application No. PCT/JP2018/041647, 1 page.
Notice of Reasons for Refusal dated Oct. 16, 2018 in corresponding Japanese Patent Application No. 2018-112529, pp. 1-8.
Extended European Search Report dated Aug. 23, 2021, issued in counterpart European Patent Application No. 18 87 5055.8, pp. 1-6.
Office Action dated Feb. 6, 2023 in corresponding Taiwanese Patent Application No. 107140045, with English-language translation
Chinese Office Action dated Dec. 30, 2022 in Chinese Patent Application No. 201880073619.1, with English language translation, pp. 1-26.

* cited by examiner

FILM STRUCTURE AND METHOD FOR MANUFACTURING THE SAME

TECHNICAL FIELD

The present invention relates to a film structure and a method for manufacturing the same.

BACKGROUND ART

As a film structure including a substrate, a conductive film formed on the substrate, and a piezoelectric film formed on the conductive film, a film structure including a substrate, a conductive film which contains platinum and is formed on the substrate, and a piezoelectric film which contains lead zirconate titanate (PZT) and is formed on the conductive film is known.

WO 2016/009698 A (Patent Literature 1) discloses a technology in which a ferroelectric ceramic is equipped with a $Pb(Zr_{1-A}Ti_{A})O_3$ film and a $Pb(Zr_{1-x}Ti_{x})O_3$ film formed on the $Pb(Zr_{1-A}Ti_{A})O_3$ film, where A and x satisfy $0 \leq A \leq 0.1$ and $0.1 < x < 1$.

JP 2014-84494 A (Patent Literature 2) discloses a technology for forming a PZT thin film on a buffer layer formed by sequentially laminating YSZ (8% $Y_2O_3$+92% $ZrO_2$), $CeO_2$, and $LaSrCoO_3$ films on a silicon substrate (Si) in advance. Moreover, Patent Literature 2 discloses a technology in which $LaSrCoO_3$ (LSCO) is lattice-rotated by 45° with respect to other films.

Non Patent Literature 1 discloses a technology in which a buffer layer in which YSZ, $CeO_2$, $La_{0.5}Sr_{0.5}CoO_3$ (LSCO), and $SrRuO_3$ (SRO) are sequentially laminated on a silicon substrate is formed and a c-axis oriented $0.06Pb(Mn_{1/3}, Nb_{2/3})O_3$-$0.94\,Pb(Zr_{0.5}Ti_{0.5})O_3$ (PMnN-PZT) epitaxial thin film is formed on the buffer layer. Non Patent Literature 1 discloses a technology in which the crystal lattice of PMnN-PZT is rotated by 45° with respect to Si in the in-plane direction.

Non Patent Literature 2 discloses a technology in which the relative dielectric constant of $PbTiO_3$ grown using an MgO single crystal crucible by a flux method is 150 at room temperature and is 1.5 times the relative dielectric constant of pure $PbTiO_3$ single crystal.

CITATION LIST

Patent Literature

Patent Literature 1: WO 2016/009698 A
Patent Literature 2: JP 2014-84494 A

Non Patent Literature

Non Patent Literature 1: S. Yoshida et al., "Fabrication and characterization of large figure-of-merit epitaxial PMnN-PZT/Si transducer for piezoelectric MEMS sensors", Sensors and Actuators A 239 (2016) 201-208

Non Patent Literature 2: M. Kobune et al., "Growth and characterization of lead titanate single crystals grown in a magnesia single crystal crucible", Yogyo-Kyokai-Shi, 1987, Vol. 95, No. 11, p. 1053-1058

SUMMARY OF INVENTION

Technical Problem

In a piezoelectric film containing lead zirconate titanate, the piezoelectric properties of the piezoelectric film deteriorate in a case in which the quality such as crystallinity of the piezoelectric film is not favorable. However, it is difficult to form, for example, a piezoelectric film which contains lead zirconate titanate and exhibits favorable quality such as crystallinity and to improve the piezoelectric properties of the piezoelectric film.

The present invention has been made to solve the problems of prior technologies as described above, and an object thereof is to provide a film structure for the formation of a piezoelectric film containing lead zirconate titanate, which can improve the piezoelectric properties of the piezoelectric film.

Solution to Problem

The outline of representative inventions among the inventions disclosed in the present application will be briefly described as follows.

A film structure as an aspect of the present invention includes a silicon substrate including a main surface composed of a (100) plane, a first film that is formed on the main surface and includes a first zirconium oxide film which has a cubic crystal structure and is (100)-oriented, and a conductive film that is formed on the first film and includes a platinum film which has a cubic crystal structure and is (100)-oriented. A first average interface roughness of a first interface between the first film and the conductive film is greater than a second average interface roughness of a second interface between the silicon substrate and the first film.

In addition, as another aspect, the first film may include a film portion formed on the main surface and a plurality of protrusion portions each protruded from an upper surface of the film portion, the film portion may include a second zirconium oxide film which has a cubic crystal structure and is (100)-oriented, and each of the plurality of protrusion portions may include a third zirconium oxide film which has a cubic crystal structure and is (100)-oriented.

In addition, as another aspect, a cross-sectional shape of the protrusion portion perpendicular to a first direction along the main surface may be a triangular shape, and a width of the protrusion portion in a second direction that is a direction which is along the main surface and perpendicular to the first direction may decrease from a film portion side toward a side opposite to the film portion side.

In addition, as another aspect, a thickness of the film portion may be 11 to 18 nm and a protrusion height of each of the plurality of protrusion portions protruded from an upper surface of the film portion may be 4 to 8 nm.

In addition, as another aspect, the conductive film may cover the plurality of protrusion portions and the conductive film may be embedded between two adjacent protrusion portions.

In addition, as another aspect, the conductive film may have a first tensile stress and the first film may have a first compressive stress or a second tensile stress weaker than the first tensile stress.

In addition, as another aspect, an upper layer portion of the first film may have a second compressive stress, a lower layer portion of the first film may have a third tensile stress, the second compressive stress may be stronger than the first compressive stress when the first film has the first compressive stress, and the third tensile stress may be stronger than the second tensile stress when the first film has the second tensile stress.

In addition, as another aspect, the film structure may include a piezoelectric film that is formed on the conductive film and includes a lead zirconate titanate film which has a tetragonal crystal structure and is (001)-oriented.

In addition, as another aspect, the first zirconium oxide film may be oriented so that a <100> direction of the first zirconium oxide film, which is a direction along the main surface, is parallel to a <100> direction of the silicon substrate, which is a direction along the main surface, and the platinum film may be oriented so that a <100> direction of the platinum film, which is a direction along the main surface, is parallel to the <100> direction of the silicon substrate, which is a direction along the main surface.

In addition, as another aspect, the first zirconium oxide film may be oriented so that a <100> direction of the first zirconium oxide film, which is a direction along the main surface, is parallel to a <100> direction of the silicon substrate, which is a direction along the main surface, and the platinum film may be oriented so that a <100> direction of the platinum film, which is a direction along the main surface, is parallel to the <100> direction of the silicon substrate, which is a direction along the main surface. In addition, the lead zirconate titanate film may be oriented so that a <100> direction of the lead zirconate titanate film, which is a direction along the main surface, is parallel to the <100> direction of the silicon substrate, which is a direction along the main surface.

In addition, as another aspect, the lead zirconate titanate film may contain a composite oxide composed of lead zirconate titanate represented by the following general formula (Chem. 1).

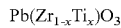

$$Pb(Zr_{1-x}Ti_x)O_3 \quad \text{(Chem.1)}$$

x may satisfy 0.32≤x≤0.52, and a lattice constant ratio of a second lattice constant in a c-axis direction of the lead zirconate titanate to a first lattice constant in an a-axis direction of the lead zirconate titanate may be 1.010 to 1.016.

A method for manufacturing a film structure as an aspect of the present invention includes the steps of: (a) preparing a silicon substrate including a main surface composed of a (100) plane; (b) forming a first film including a first zirconium oxide film which has a cubic crystal structure and is (100)-oriented on the main surface; and (c) forming a conductive film including a platinum film which has a cubic crystal structure and is (100)-oriented on the first film. A first average interface roughness of a first interface between the first film and the conductive film is greater than a second average interface roughness of a second interface between the silicon substrate and the first film.

In addition, as another aspect, in the step (b), the first film including a film portion formed on the main surface and a plurality of protrusion portions each protruded from an upper surface of the film portion may be formed, the film portion may include a second zirconium oxide film which has a cubic crystal structure and is (100)-oriented, and each of the plurality of protrusion portions may include a third zirconium oxide film which has a cubic crystal structure and is (100)-oriented.

In addition, as another aspect, a cross-sectional shape of the protrusion portion perpendicular to a first direction along the main surface may be a triangular shape, and a width of the protrusion portion in a second direction that is a direction which is along the main surface and perpendicular to the first direction may decrease from a film portion side toward a side opposite to the film portion side.

In addition, as another aspect, a thickness of the film portion may be 11 to 18 nm and a protrusion height of each of the plurality of protrusion portions protruded from an upper surface of the film portion may be 4 to 8 nm.

In addition, as another aspect, in the step (c), the conductive film covering the plurality of protrusion portions may be formed, and in the step (c), the conductive film may be embedded between two adjacent protrusion portions.

In addition, as another aspect, the conductive film may have a first tensile stress and the first film may have a first compressive stress or a second tensile stress weaker than the first tensile stress.

In addition, as another aspect, an upper layer portion of the first film may have a second compressive stress, a lower layer portion of the first film may have a third tensile stress, the second compressive stress may be stronger than the first compressive stress when the first film has the first compressive stress, and the third tensile stress may be stronger than the second tensile stress when the first film has the second tensile stress.

In addition, as another aspect, the method for manufacturing a film structure may include the step of: (d) forming a piezoelectric film including a lead zirconate titanate film which has a tetragonal crystal structure and is (001)-oriented on the conductive film.

In addition, as another aspect, the first zirconium oxide film may be oriented so that a <100> direction of the first zirconium oxide film, which is a direction along the main surface, is parallel to a <100> direction of the silicon substrate, which is a direction along the main surface, and the platinum film may be oriented so that a <100> direction of the platinum film, which is a direction along the main surface, is parallel to the <100> direction of the silicon substrate, which is a direction along the main surface.

In addition, as another aspect, the first zirconium oxide film may be oriented so that a <100> direction of the first zirconium oxide film, which is a direction along the main surface, is parallel to a <100> direction of the silicon substrate, which is a direction along the main surface, and the platinum film may be oriented so that a <100> direction of the platinum film, which is a direction along the main surface, is parallel to the <100> direction of the silicon substrate, which is a direction along the main surface. In addition, the lead zirconate titanate film may be oriented so that a <100> direction of the lead zirconate titanate film, which is a direction along the main surface, is parallel to the <100> direction of the silicon substrate, which is a direction along the main surface.

In addition, as another aspect, the lead zirconate titanate film may contain a composite oxide composed of lead zirconate titanate represented by the following general formula (Chem. 1).

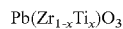

$$Pb(Zr_{1-x}Ti_x)O_3 \quad \text{(Chem.1)}$$

x may satisfy 0.32≤x≤0.52, and a lattice constant ratio of a second lattice constant in a c-axis direction of the lead zirconate titanate to a first lattice constant in an a-axis direction of the lead zirconate titanate may be 1.010 to 1.016.

Advantageous Effects of Invention

By applying an aspect of the present invention, it is possible to improve the piezoelectric properties of the piezoelectric film in a film structure for the formation of a piezoelectric film containing lead zirconate titanate.

DESCRIPTION OF EMBODIMENTS

Figure 1:
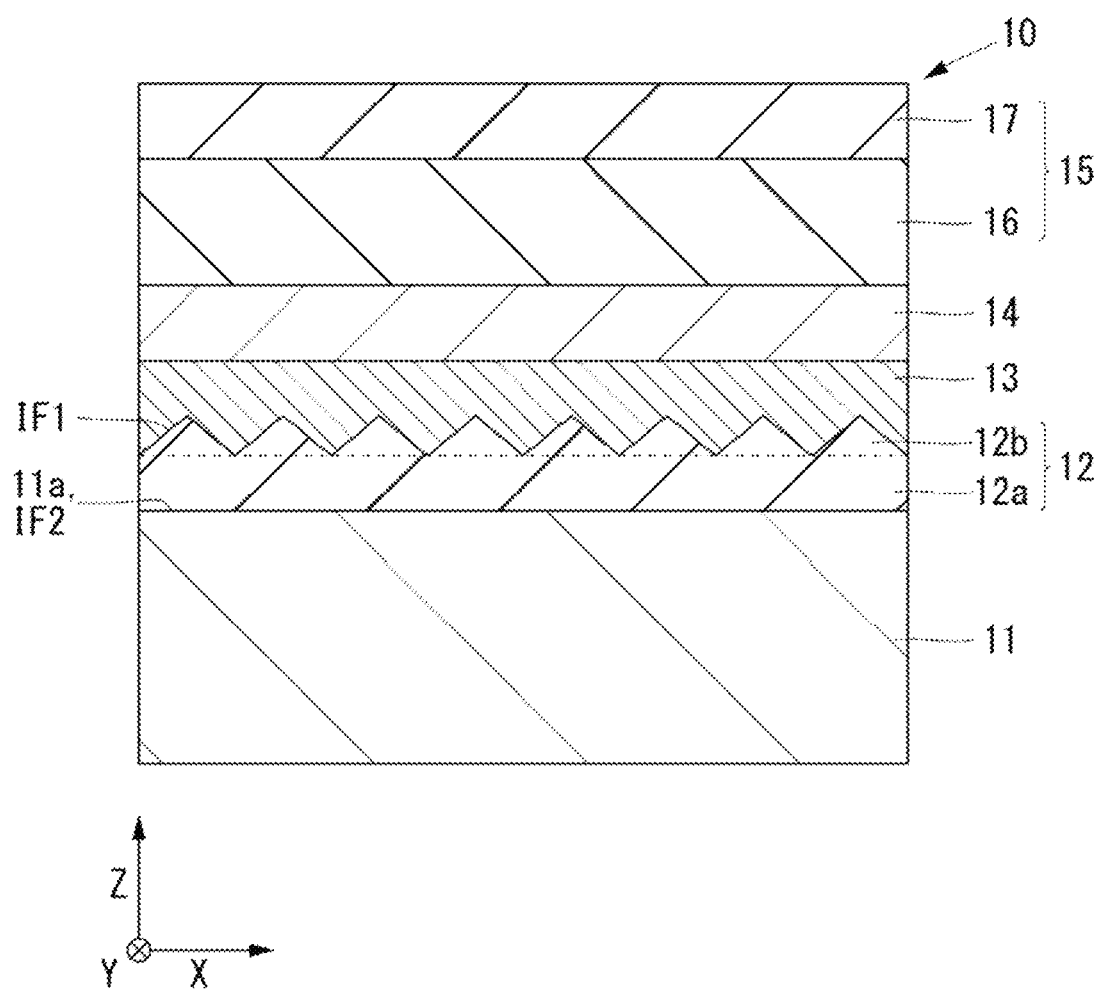
FIG. 1 is a cross-sectional view of a film structure according to an embodiment.

Hereinafter, the respective embodiments of the present invention will be described with reference to the drawings.

It should be noted that the disclosure is merely an example, and appropriate changes that can easily be conceived by those skilled in the art while maintaining the gist of the invention are naturally included in the scope of the present invention. In addition, in order to make the description clearer, the width, thickness, shape, and the like of each portion in the drawings may be schematically illustrated as compared with those in the embodiments, but this is merely an example and does not limit the interpretation of the present invention.

Moreover, in the present description and the respective drawings, the same elements as those described in relation with the already-described drawings are denoted by the same reference numerals and the detailed description thereof may be appropriately omitted.

Furthermore, in the drawings used in the embodiments, hatching (halftone dot meshing) attached to distinguish structures from each other may be omitted depending on the drawings.

Incidentally, in the following embodiments, when a range is indicated as A to B, it indicates A or more and B or less unless otherwise specified.

(Embodiment)

<Film Structure>

Figure 2:
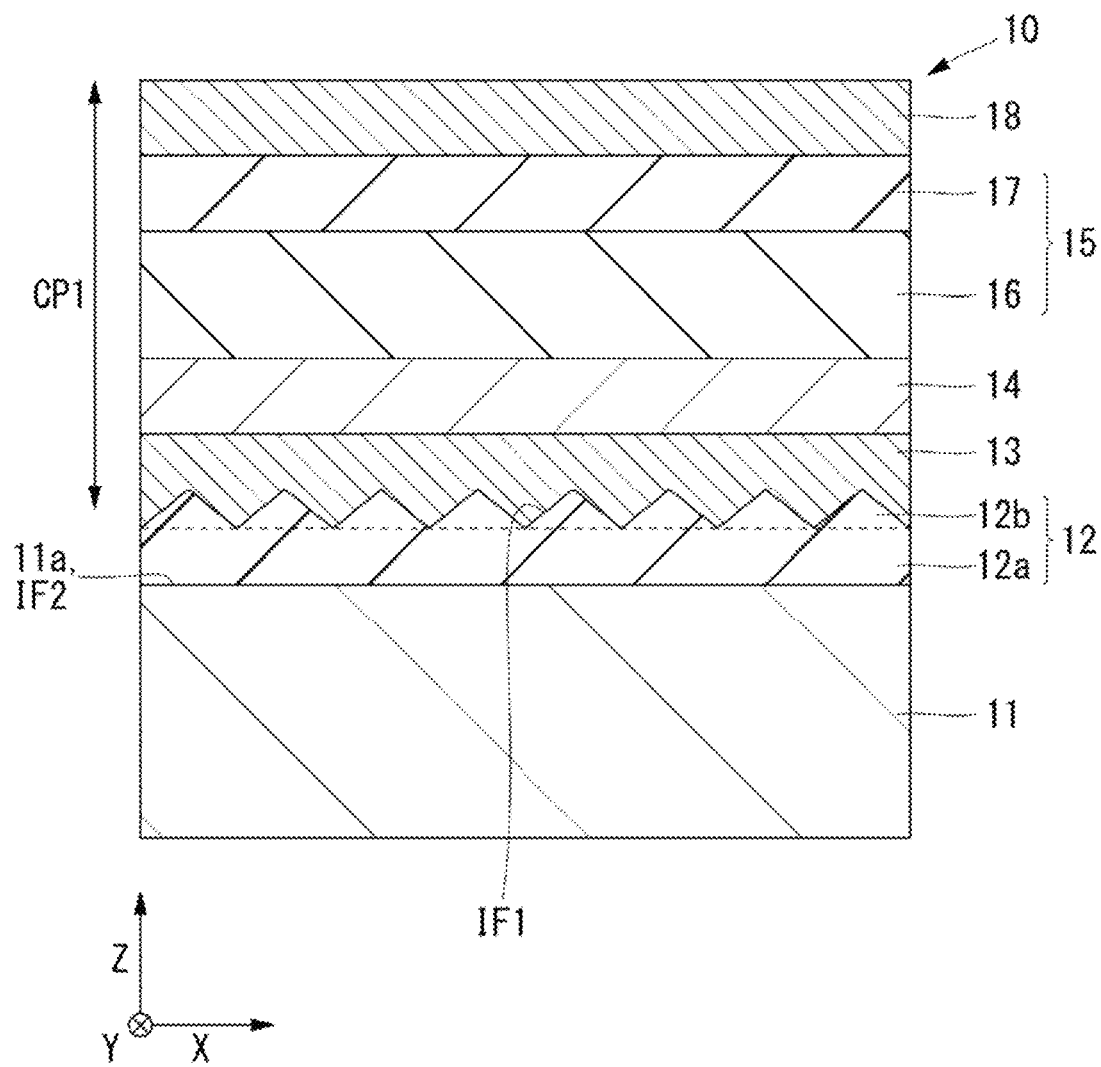
FIG. 2 is a cross-sectional view of a film structure according to an embodiment in a case in which the film structure has a conductive film as an upper electrode.
Figure 3:
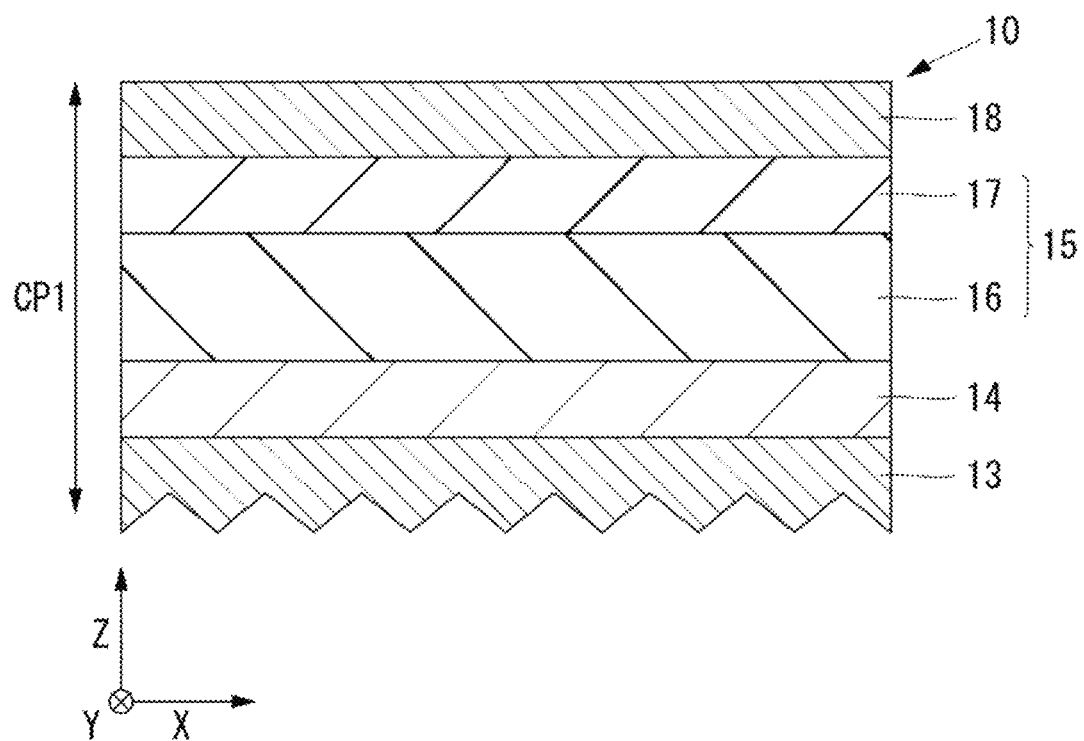
FIG. 3 is a cross-sectional view of a film structure in a case in which the substrate and the alignment film have been removed from the film structure illustrated in FIG. 2.
Figure 4:
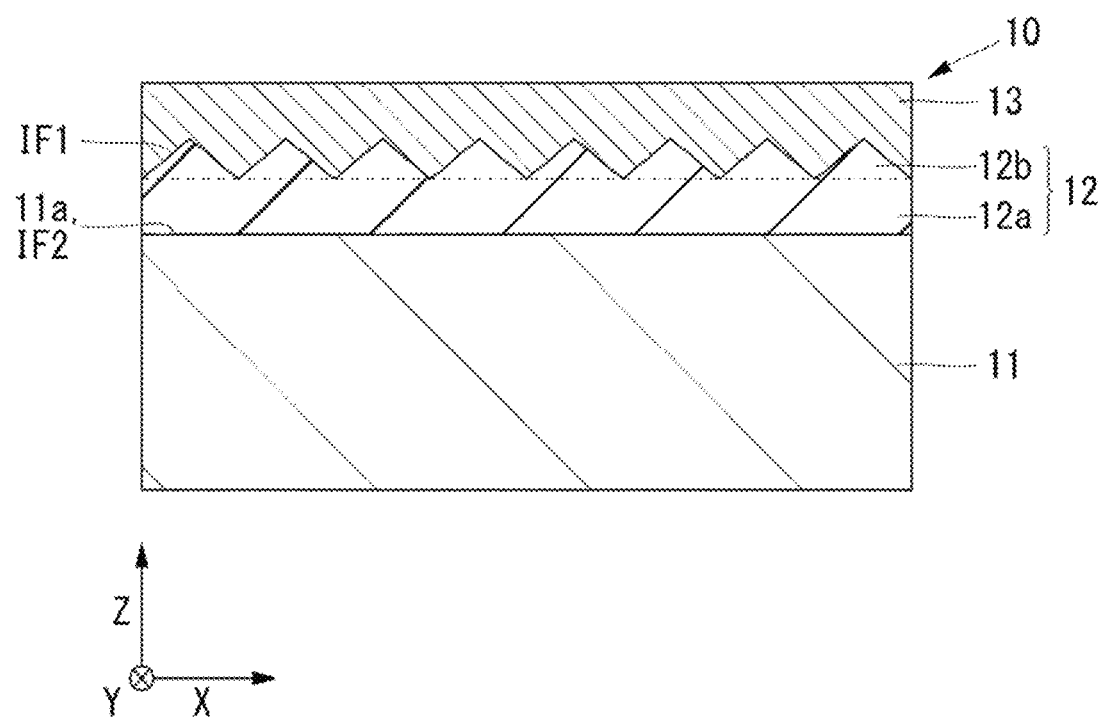
FIG. 4 is a cross-sectional view of another example of a film structure according to an embodiment.
Figure 5:
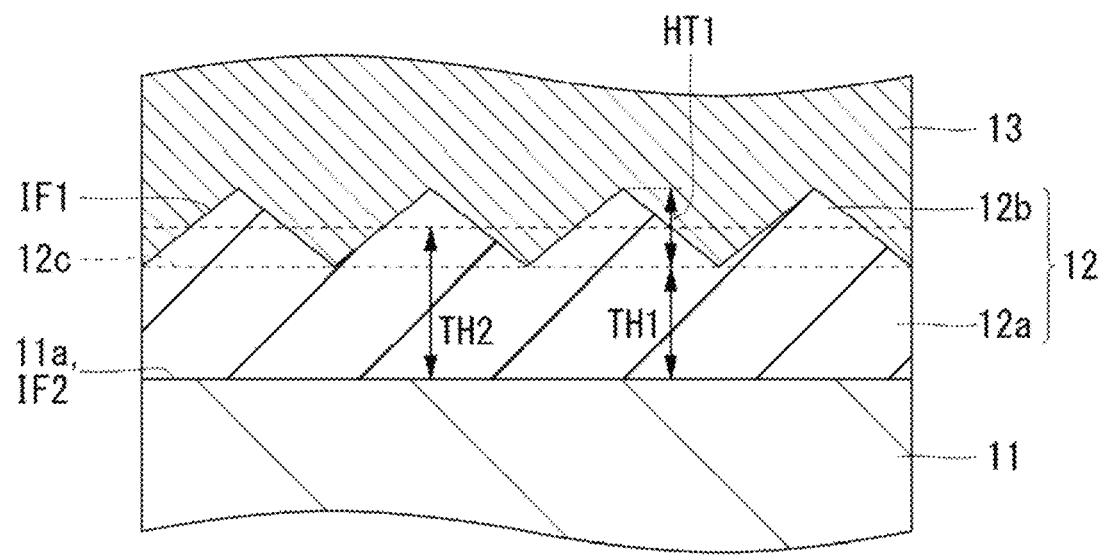
FIG. 5 is an enlarged cross-sectional view illustrating a part of the film structure illustrated in FIG. 4.
Figure 6:
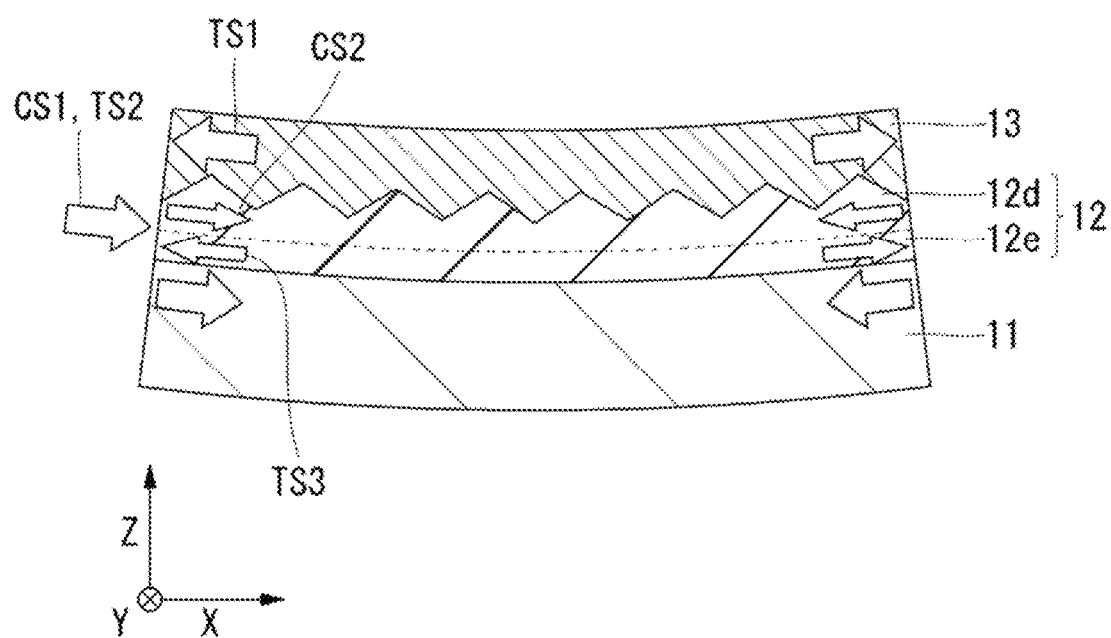
FIG. 6 is a cross-sectional view of the film structure illustrated in FIG. 4.
Figure 7:
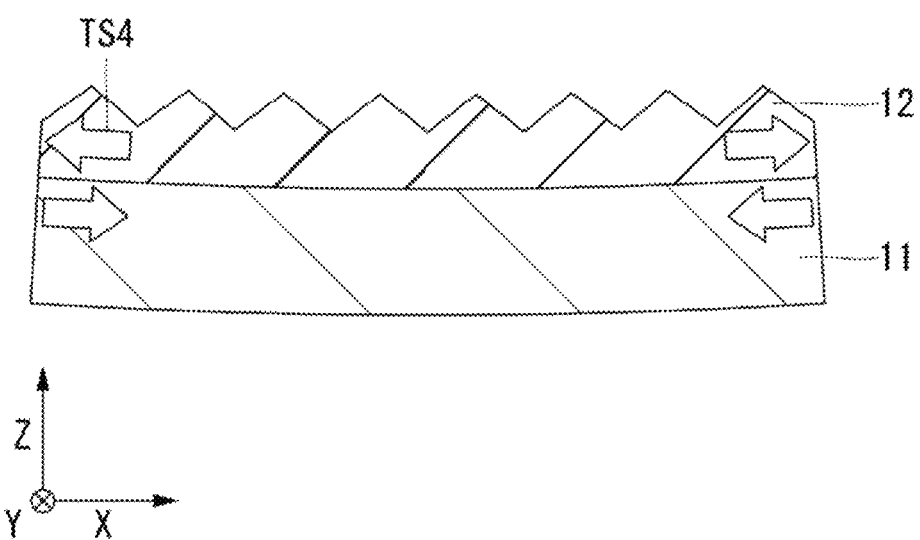
FIG. 7 is a cross-sectional view of a film structure in a manufacturing process of the film structure illustrated in FIG. 4.

First, a film structure according to an embodiment, which is an embodiment of the present invention, will be described. FIG. 1 is a cross-sectional view of a film structure according to an embodiment. FIG. 2 is a cross-sectional view of a film structure according to an embodiment in a case in which the film structure has a conductive film as an upper electrode. FIG. 3 is a cross-sectional view of a film structure in a case in which the substrate and the alignment film have been removed from the film structure illustrated in FIG. 2. FIG. 4 is a cross-sectional view of another example of a film structure according to an embodiment. FIG. 5 is an enlarged cross-sectional view illustrating a part of the film structure illustrated in FIG. 4. FIG. 6 is a cross-sectional view of the film structure illustrated in FIG. 4. FIG. 6 schematically illustrates the stress of the film structure illustrated in FIG. 4 in addition to the cross-sectional view of the film structure. FIG. 7 is a cross-sectional view of a film structure in a manufacturing process of the film structure illustrated in FIG. 4. FIG. 7 schematically illustrates the stress of the film structure in addition to a cross-sectional view of the film structure at the time point at which the alignment film is formed on the substrate.

As illustrated in FIG. 1, a film structure 10 according to the present embodiment includes a substrate 11, an alignment film 12, a conductive film 13, a film 14, and a piezoelectric film 15. The alignment film 12 is formed on the substrate 11. The conductive film 13 is formed on the alignment film 12. The film 14 is formed on the conductive film 13. The piezoelectric film 15 is formed on the film 14.

Incidentally, as illustrated in FIG. 2, the film structure 10 according to the present embodiment may include a conductive film 18. The conductive film 18 is formed on the piezoelectric film 15. At this time, the conductive film 13 is a conductive film as a lower electrode, and the conductive film 18 is a conductive film as an upper electrode. In addition, as illustrated in FIG. 3, the film structure 10 according to the present embodiment may not include the substrate 11 (see FIG. 2) and the alignment film 12 (see FIG. 2) but may include only the conductive film 13 as a lower electrode, the film 14, the piezoelectric film 15, and the conductive film 18 as an upper electrode.

In addition, as illustrated in FIG. 4, the film structure 10 according to the present embodiment may include only the substrate 11, the alignment film 12, and the conductive film 13. In such a case, the film structure 10 can be used as an electrode substrate for forming the piezoelectric film 15, and the piezoelectric film 15 which is epitaxially grown and exhibits favorable piezoelectric properties can be easily formed on the conductive film 13.

The substrate 11 is a silicon substrate composed of silicon (Si) single crystal. The substrate 11 as a silicon substrate includes an upper surface 11a as a main surface composed of a (100) plane. The alignment film 12 is formed on the upper surface 11a and contains zirconium oxide (zirconium oxide film) that has a cubic crystal structure and is (100)-oriented. The conductive film 13 contains platinum (platinum film) that has a cubic crystal structure and is (100)-oriented. This makes it possible to orient the piezoelectric film 15 on the substrate 11 in the (001) orientation in tetragonal crystal display or the (100) orientation in pseudo-cubic crystal display in a case in which the piezoelectric film 15 contains a composite oxide having a perovskite structure.

Here, the fact that the alignment film 12 is (100)-oriented means that the (100) plane of the alignment film 12 having a cubic crystal structure is along the upper surface 11a as a main surface composed of the (100) plane of the substrate 11, which is a silicon substrate, and suitably means that the (100) plane of the alignment film 12 is parallel to the upper surface 11a composed of the (100) plane of the substrate 11, which is a silicon substrate. In addition, the fact that the (100) plane of the alignment film 12 is parallel to the upper surface 11a composed of the (100) plane of the substrate 11 includes not only a case in which the (100) plane of the alignment film 12 is completely parallel to the upper surface 11a of the substrate 11 but also a case in which the angle formed by the plane completely parallel to the upper surface 11a of the substrate 11 and the (100) plane of the alignment film 12 is 20° or less. Moreover, the same applies to the orientation of the films of other layers as well as the alignment film 12.

Alternatively, as the alignment film 12, the alignment film 12 composed of a laminated film may be formed on the substrate 11 instead of the alignment film 12 composed of a single-layer film.

As illustrated in FIGS. 1, 2, 4, and 5, the alignment film 12 includes a film portion 12a formed on the upper surface 11a of the substrate 11 and a plurality of protrusion portions 12b each protruded from the upper surface of the film portion 12a. In addition, the film portion 12a contains zirconium oxide (zirconium oxide film) that has a cubic crystal structure and is (100)-oriented. Moreover, each of the plurality of protrusion portions 12b contains zirconium oxide (zirconium oxide film) that has a cubic crystal structure and is (100)-oriented.

By this, the interface roughness (roughness) of an interface IF1 between the alignment film 12 and the conductive film 13 increases and the average interface roughness of the interface IF1 between the alignment film 12 and the conductive film 13 is greater than the average interface roughness of an interface IF2 between the substrate 11 and the alignment film 12. Hence, for example, the surface of the alignment film 12 becomes a surface other than the (100) plane of the zirconium oxide film included in the alignment film 12, and the platinum film is likely to be epitaxially grown on the surface of the zirconium oxide film as a surface other than the (100) plane of the platinum film included in the conductive film 13 is epitaxially grown on the surface other than the (100) plane of the zirconium oxide film, and the like. Moreover, the conductive film 13 including the platinum film is likely to be epitaxially grown, thus the film 14 and the piezoelectric film 15 are likely to be epitaxially grown, and as a result, the piezoelectric properties of the piezoelectric film 15 can be improved.

Alternatively, it is only required that the average interface roughness of the interface IF1 between the alignment film 12 and the conductive film 13 is greater than the average interface roughness of the interface IF2 between the substrate 11 and the alignment film 12, and thus the alignment film 12 need not clearly have the plurality of protrusion portions 12b or may have, for example, a step-terrace structure having a plurality of steps (steps) formed on the surface so as to be separated from each other in plan view.

The average interface roughness can be calculated by capturing an image of a cross section of the film structure using a transmission electron microscope (TEM), for example, so that the interface IF1 and the interface IF2 are captured in the same image and performing arithmetic processing of the captured image using a computer. In addition, the kind of the parameter indicating the average interface roughness of each of the interface IF1 and the interface IF2 is not particularly limited, and it is only required that the same kind of parameter is used. Hence, the average interface roughness can be compared using various parameters such as arithmetic average roughness $R_a$ and root mean square height $R_{rms}$ as the parameter indicating the average interface roughness. For example, in a case in which protrusion heights HT1 of the plurality of protrusion portions 12b are all 6 nm and, for example, the arithmetic average roughness $R_a$ is used as the average interface roughness, the arithmetic average roughness $R_a$ is 3 nm.

Suitably, the cross-sectional shape of the protrusion portion 12b perpendicular to the first direction along the upper surface 11a of the substrate 11 is a triangular shape and the width of the protrusion portion 12b in the second direction that is a direction which is along the upper surface 11a of the substrate 11 and perpendicular to the first direction decreases from the film portion 12a side, namely, the substrate 11 side toward the side opposite to the film portion 12a side, namely, the side opposite to the substrate 11 side. In a case in which the protrusion portion 12b has such a triangular shape, the platinum film included in the conductive film 13 is more likely to be epitaxially grown on the surface of the zirconium oxide film included in the alignment film 12.

Suitably, a thickness TH1 of the film portion 12a (see FIG. 5) is 11 to 18 nm and the protrusion height HT1 (see FIG. 5) of each of the plurality of protrusion portions 12b protruded from an upper surface 12c (see FIG. 5) of the film portion 12a is 4 to 8 nm. In other words, a thickness TH2 (see FIG. 5) of the alignment film 12 is suitably 13 to 22 nm.

In a case in which the protrusion height HT1 of the protrusion portion 12b is 4 nm or more, the average interface roughness of the interface IF1 can be surely increased to be greater than the average interface roughness of the interface IF2 as compared with a case in which the protrusion height HT1 of the protrusion portion 12b is less than 4 nm, and thus platinum contained in the conductive film 13 formed on the alignment film 12 containing (100)-oriented zirconium oxide is likely to be (100)-oriented. Meanwhile, in a case in which the protrusion height HT1 of the protrusion portion 12b is 8 nm or less, the average interface roughness of the interface IF1 is not too great as compared with a case in which the protrusion height HT1 of the protrusion portion 12b exceeds 8 nm, and thus the flatness of the conductive film 13 formed on the alignment film 12 containing (100)-oriented zirconium oxide can be improved.

In addition, in a case in which the thickness TH1 of the film portion 12a is 11 nm or more, the thickness TH2 of the alignment film 12 is thick to a certain extent as compared with a case in which the thickness TH1 of the film portion 12a is less than 11 nm, thus the alignment film 12 is uniformly formed over the entire upper surface 11a of the substrate 11 and direct contact between the conductive film 13 and the substrate 11 can be prevented. In addition, in a case in which the thickness TH1 of the film portion 12a is 11 nm or more, the thickness TH2 of the alignment film 12 is thick to a certain extent as compared with a case in which the thickness TH1 of the film portion 12a is less than 11 nm, thus the protrusion height HT1 of the protrusion portion 12b is likely to be set to 4 nm or more and platinum contained in the conductive film 13 is likely to be (100)-oriented. Meanwhile, in a case in which the thickness TH1 of the film portion 12a is 18 nm or less, the average interface roughness of the interface IF1 is not too great as compared with a case in which the thickness TH1 of the film portion 12a exceeds 18 nm, and thus the flatness of the conductive film 13 formed on the alignment film 12 can be improved.

In other words, in a case in which the thickness TH2 of the alignment film 12 is 13 nm or more, the alignment film 12 is uniformly formed over the entire upper surface 11a of the substrate 11 and direct contact between the conductive film 13 and the substrate 11 can be prevented as compared with a case in which the thickness TH2 of the alignment film 12 is less than 13 nm. In addition, in a case in which the thickness TH2 of the alignment film 12 is 13 nm or more, the protrusion height HT1 of the protrusion portion 12b is likely to be set to 4 nm or more and platinum contained in the conductive film 13 is likely to be (100)-oriented as compared with a case in which the thickness TH2 of the alignment film 12 is less than 13 nm. Meanwhile, in a case in which the thickness TH2 of the alignment film 12 is 22 nm or less, the average interface roughness of the interface IF1 is not too great as compared with a case in which the thickness TH2 of the alignment film 12 exceeds 22 nm, and thus the flatness of the conductive film 13 formed on the alignment film 12 can be improved.

Suitably, the conductive film 13 covers the plurality of protrusion portions 12b, and the conductive film 13 is embedded between two adjacent protrusion portions 12b. In a case in which the conductive film 13 has such a shape, the area of the interface between the conductive film 13 and the alignment film 12 increases and the adhesive force of the conductive film 13 to the alignment film 12 increases.

Incidentally, it is only required that the platinum film included in the conductive film 13 can be epitaxially grown on the surface of the zirconium oxide film included in the alignment film 12, and thus the cross-sectional shape of the protrusion portion 12b perpendicular to the first direction along the upper surface 11a of the substrate 11 may not be a triangular shape. In other words, the width of the protrusion portion 12b in the second direction that is a direction which is along the upper surface 11a of the substrate 11 and perpendicular to the first direction may not decrease from the film portion 12a side, namely, the substrate 11 side toward the side opposite to the film portion 12a side, namely, the side opposite to the substrate 11 side.

In the film structure illustrated in FIG. 4, suitably, the conductive film 13 has a tensile stress TS1 and the alignment film 12 has a compressive stress CS1 or a tensile stress TS2 weaker than the tensile stress TS1 as illustrated in FIG. 6.

In the manufacturing process of the film structure illustrated in FIG. 4, the stress at the time point at which the alignment film 12 is formed on the substrate 11 as illustrated in FIG. 7 will be described. The alignment film 12 has a tensile stress TS4 at the time point at which the alignment film 12 is formed on the substrate 11.

The linear expansion coefficient $\alpha_{ZrO2}$ of zirconium oxide ($ZrO_2$) is about $9 \times 10^{-6}$ °C.$^{-1}$, the linear expansion coefficient $\alpha_{Si}$ of silicon (Si) is about $4 \times 10^{-6}$ °C.$^{-1}$, and the linear expansion coefficient $\alpha_{ZrO2}$ of zirconium oxide is greater than the linear expansion coefficient $\alpha_{Si}$ of silicon (Si). In such a case, when the alignment film 12 composed of zirconium oxide is formed on the substrate 11 composed of silicon at a temperature of, for example, 550° C. and then the substrate 11 is cooled from 550° C. to room temperature (30° C.), the alignment film 12 shrinks along the upper surface 11a of the substrate 11 but the substrate 11 does not shrink as much as the alignment film 12, and thus the alignment film 12 is pulled by being bound to the substrate 11 and cannot completely shrink. As a result, the alignment film 12 has a tensile stress TS4, the substrate 11 has a compressive stress, and the substrate 11 is curved in a downward convex shape as illustrated in FIG. 7.

Meanwhile, the linear expansion coefficient $\alpha_{Pt}$ of platinum (Pt) is also about $9 \times 10^{-6}$ °C.$^{-1}$ and the linear expansion coefficient $\alpha_{Pt}$ of platinum (Pt) is also greater than the linear expansion coefficient $\alpha_{Si}$ of silicon (Si). In such a case, when the conductive film 13 composed of platinum is formed on the alignment film 12 at a temperature of, for example, 550° C. and then the substrate 11 is cooled from 550° C. to room temperature (30° C.), the conductive film 13 shrinks along the upper surface 11a of the substrate 11 but the substrate 11 does not shrink as much as the conductive film 13, and thus the conductive film 13 is pulled by being bound to the substrate 11 and cannot completely shrink. Hence, the conductive film 13 has a tensile stress TS1. In addition, the alignment film 12 is pulled from the substrate 11 but is compressed by the conductive film 13 or hardly receives force from the conductive film 13. Hence, the alignment film 12 has a compressive stress CS1 or a tensile stress TS2 weaker than the tensile stress TS1.

Incidentally, in a case in which the thickness of the conductive film 13 is thicker than the thickness of the alignment film 12, the alignment film 12 is compressed by the conductive film 13. Hence, an upper layer portion 12d of the alignment film 12 has a compressive stress CS2 and a lower layer portion 12e of the alignment film 12 has a tensile stress TS3 as illustrated in FIG. 6. Moreover, the compressive stress CS2 is stronger than the compressive stress CS1 when the alignment film 12 has a compressive stress CS1 as a whole, and the tensile stress TS3 is stronger than the tensile stress TS2 when the alignment film 12 has a tensile stress TS2 as a whole.

Suitably, the alignment film 12 is epitaxially grown on the upper surface 11a of the substrate 11 and the conductive film 13 is epitaxially grown on the alignment film 12. This makes it possible to epitaxially grow the piezoelectric film 15 on the conductive film 13 in a case in which the piezoelectric film 15 contains a composite oxide having a perovskite structure.

Here, when two directions orthogonal to each other in the upper surface 11a as the main surface of the substrate 11 are defined as an X-axis direction and a Y-axis direction and the direction perpendicular to the upper surface 11a is defined as a Z-axis direction, the fact that a certain film is epitaxially grown means that the film is oriented in any of the X-axis direction, the Y-axis direction, or the Z-axis direction. Incidentally, the suitable orientation direction in the upper surface 11a will be described with reference to FIG. 10 to be described later. In addition, the above-described first direction corresponds to the Y-axis direction and the above-described second direction corresponds to the X-axis direction.

The film 14 contains a composite oxide that is represented by the following general formula (Chem. 2) and (100)-oriented in pseudo-cubic crystal display.

$$Sr(Ti_{1-z}Ru_z)O_3 \quad \text{(Chem.2)}$$

Here, z satisfies $0 \leq z \leq 1$. Incidentally, in the following description, $Sr(Ti_{1-z}Ru_z)O_3$ when z satisfies z=0, namely, $SrTiO_3$ is referred to as STO, $Sr(Ti_{1-z}Ru_z)O_3$ when z satisfies $0<z<1$ is referred to as STRO, and $Sr(Ti_{1-z}Ru_z)O_3$ when z satisfies z=1, namely, $SrRuO_3$ is referred to as SRO in some cases.

SRO exhibits metal conductivity, and STO exhibits semi-conductivity or insulating properties. Hence, the conductivity of the film 14 is improved as z approaches 1, and thus the film 14 can be used as a part of the lower electrode including the conductive film 13.

Here, in a case in which the film 14 is formed by a sputtering method, z satisfies preferably $0 \leq z \leq 0.4$ and more preferably $0.05 \leq z \leq 0.2$. This is because there is a possibility that the composite oxide represented by the general formula (Chem. 2) becomes a powder but is not sufficiently solidified and it is difficult to produce a sputtering target in a case in which z exceeds 0.4.

On the other hand, in a case in which the film 14 is formed by, for example, a coating method such as a sol-gel method, the film 14 can be easily formed even when z>0.4.

The fact that the composite oxide which is represented by the general formula (Chem. 2) and has a perovskite structure is (100)-oriented in pseudo-cubic crystal display means the following cases.

First, a case is considered in which the unit lattice contains one atom A, one atom B, and three oxygen atoms in a crystal lattice which includes a unit lattice arranged in three dimensions and has a perovskite structure represented by a general formula $ABO_3$.

In such a case, being (100)-oriented in pseudo-cubic crystal display means a case in which the unit lattice has a cubic crystal structure and is (100)-oriented. At this time, the length of one side of the unit lattice is defined as a lattice constant $a_c$.

Meanwhile, a case is considered in which the composite oxide which is represented by the general formula (Chem. 2) and has a perovskite structure has an orthorhombic crystal structure. Moreover, a case is considered in which the first lattice constant $a_o$ among the three lattice constants of orthorhombic crystal is substantially equal to $2^{1/2}$ times the lattice constant $a_c$ of pseudo-cubic crystal, the second lattice constant $b_o$ among the three lattice constants of orthorhombic crystal is substantially equal to 2 times the lattice constant $a_c$ of pseudo-cubic crystal, and the third lattice constant $c_o$ among the three lattice constants of orthorhombic crystal is substantially equal to $2^{1/2}$ times the lattice constant $a_c$ of pseudo-cubic crystal. Incidentally, in the description of the present application, the fact that the numerical value V1 and the numerical value V2 are substantially equal to each other means that the ratio of the difference between the numerical value V1 and the numerical value V2 to the average of the numerical value V1 and the numerical value V2 is about 5% or less.

At this time, being (100)-oriented in pseudo-cubic crystal display means being (101)-oriented or (020)-oriented in orthorhombic crystal display.

As the film 14 is represented by the general formula (Chem. 2) and $0 \leq z \leq 1$ is satisfied, the lattice constant $a_c$ of pseudo-cubic crystal satisfies 0.390 nm$\leq a_c \leq$0.393 nm, and thus the film 14 can be (100)-oriented in pseudo-cubic crystal display on the conductive film 13 as will be described later with reference to FIG. 10.

The piezoelectric film 15 is formed on the conductive film 13 with the film 14 interposed therebetween and contains lead zirconate titanate (PZT) as a composite oxide that has a tetragonal crystal structure and is (001)-oriented, namely, a PZT film. Alternatively, in a case in which PZT contained in the piezoelectric film 15 includes a portion having a tetragonal crystal structure and a portion having a rhombohedral crystal structure, the piezoelectric film 15 may be formed on the conductive film 13 with the film 14 interposed therebetween and contain lead zirconate titanate (PZT) as a (100)-oriented composite oxide in pseudo-cubic crystal display.

The fact that the piezoelectric film 15 contains PZT means that the piezoelectric film 15 contains a composite oxide represented by the following general formula (Chem. 3).

$$Pb(Zr_{1-u}Ti_u)O_3 \quad \text{(Chem.3)}$$

u satisfies $0<u<1$.

In addition, in a case in which the piezoelectric film 15 contains PZT that has a tetragonal crystal structure and is (001)-oriented, $2\theta_{004}$ satisfies the following equation (Math. 1) where $2\theta_{004}$ denotes the diffraction angle of the diffraction peak of the (004) plane in tetragonal crystal display of lead zirconate titanate in the X-ray diffraction pattern of the piezoelectric film 15 by the θ-2θ method using CuKα radiation in the present embodiment.

$$2\theta_{004} \leq 96.5° \quad \text{(Math. 1)}$$

By this, the interval of the (004) plane in tetragonal crystal display of lead zirconate titanate increases. Alternatively, the content of lead zirconate titanate that has a tetragonal crystal structure and is (001)-oriented (c-axis oriented) in the piezoelectric film 15 can be increased to be higher than the content of lead zirconate titanate that has a tetragonal crystal structure and is (100)-oriented (a-axis oriented) in the piezoelectric film 15. Consequently, the polarization direction of each of the plurality of crystal grains contained in the piezoelectric film 15 can be put in order and thus the piezoelectric properties of the piezoelectric film 15 can be improved.

On the other hand, in a case in which the piezoelectric film 15 contains (100)-oriented PZT in pseudo-cubic crystal display, it can be considered as follows.

A case is considered in which PZT contained in the piezoelectric film 15 has a tetragonal crystal structure, two lattice constants of tetragonal crystal are $a_t$ and $c_t$, $a_t$ and $c_t$ satisfy $c_t > a_t$, and the unit lattice is a rectangular parallelepiped in which the lengths of three sides orthogonal to each other are $a_t$, $a_t$, and $c_t$. Moreover, a case is considered in which the lattice constant $a_t$ of tetragonal crystal is substantially equal to the lattice constant $a_c$ of pseudo-cubic crystal and the lattice constant $c_t$ of tetragonal crystal is substantially equal to the lattice constant $a_c$ of pseudo-cubic crystal. In such cases, the fact that PZT is (100)-oriented in pseudo-cubic crystal display means that PZT is (100)-oriented (a-axis oriented) or (001)-oriented (c-axis oriented) in tetragonal crystal display.

Meanwhile, a case is considered in which PZT contained in the piezoelectric film 15 has a rhombohedral crystal structure and the lattice constant of rhombohedral crystal is $a_r$. Moreover, a case is considered in which the lattice constant $a_r$ of rhombohedral crystal is substantially equal to the lattice constant $a_c$ of pseudo-cubic crystal. In such cases, the fact that PZT is (100)-oriented in pseudo-cubic crystal display means that PZT is (100)-oriented in rhombohedral crystal display.

In such a case, $2\theta_{400}$ satisfies the equation ($2\theta_{400} \leq 96.5°$ in which $2\theta_{400}$ is substituted for $2\theta_{004}$ in the equation (Math. 1) where $2\theta_{400}$ denotes the diffraction angle of the diffraction peak of the (400) plane in pseudo-cubic crystal display of lead zirconate titanate in the X-ray diffraction pattern of the piezoelectric film 15 by the θ-2θ method using CuKα radiation in the present embodiment. Moreover, the interval of the (400) plane in pseudo-cubic crystal display of lead zirconate titanate increases by this. Hence, the content of lead zirconate titanate that has a tetragonal crystal structure and is (001)-oriented in the piezoelectric film 15 can be increased to be higher than the content of lead zirconate titanate that has a tetragonal crystal structure and is (100)-oriented in the piezoelectric film 15. Consequently, the polarization direction of each of the plurality of crystal grains contained in the piezoelectric film 15 can be put in order and thus the piezoelectric properties of the piezoelectric film 15 can be improved.

In addition, in the present embodiment, $\varepsilon_r$ satisfies the following equation (Math. 2) where $\varepsilon_r$ denotes the relative dielectric constant of the piezoelectric film 15.

$$\varepsilon_r \leq 450 \quad \text{(Math. 2)}$$

By this, in a case in which the film structure 10 is used as, for example, a pressure sensor utilizing the piezoelectric effect, it is possible to improve the detection sensitivity and to easily design the detection circuit of the pressure sensor. Alternatively, in a case in which the film structure 10 is used as, for example, an ultrasonic vibrator utilizing the inverse piezoelectric effect, it is possible to easily design an oscillation circuit.

In a case in which the quality such as the crystallinity of the piezoelectric film is not favorable in a film structure having a piezoelectric film containing lead zirconate titanate, for example, by a reason that the film density is low or the content of lead zirconate titanate is low, the piezoelectric properties of the piezoelectric film deteriorate. On the other hand, in a case in which the quality such as the crystallinity of the piezoelectric film is favorable in a film structure having a piezoelectric film containing lead zirconate titanate, for example, by a reason that the film density is high or the content of lead zirconate titanate is high, the piezoelectric properties of the piezoelectric film are improved but the relative dielectric constant of the piezoelectric film does not decrease in some cases.

As described above, in a film structure including a piezoelectric film containing lead zirconate titanate, there is a case in which the relative dielectric constant of the piezoelectric film does not decrease when the piezoelectric properties of the piezoelectric film are improved. Moreover, when the relative dielectric constant of the piezoelectric film does not decrease, for example, in a case in which the piezoelectric film is used as a pressure sensor, there is a possibility that the detection sensitivity of the pressure sensor decreases, for example, by a reason that the capacity of the pressure sensor increases and it is difficult to design the detection circuit of the pressure sensor.

In the film structure 10 of the present embodiment, $2\theta_{004}$ satisfies the equation (Math. 1), and $\varepsilon_r$ satisfies the equation (Math. 2). As $2\theta_{004}$ satisfies the equation (Math. 1), the content of lead zirconate titanate that has a tetragonal crystal structure and is (001)-oriented in the piezoelectric film 15 increases, and thus the piezoelectric properties can be improved. In addition, as $\varepsilon_r$ satisfies the equation (Math. 2), the relative dielectric constant decreases, and thus the detection sensitivity of the pressure sensor can be enhanced. Consequently, according to the film structure 10 of the present embodiment, it is possible to improve the piezoelectric properties and the detection sensitivity of a sensor utilizing the piezoelectric effect. In other words, in a film structure including a piezoelectric film containing lead zirconate titanate, it is possible to improve the piezoelectric properties of the piezoelectric film and the detection sensitivity of a pressure sensor utilizing the piezoelectric film.

As described in Non Patent Literature 2, when the piezoelectric film is a single crystal film and the crystallinity including orientation is improved, the relative dielectric constant decreases in the case of $PbTiO_3$. Consequently, it is considered that the relative dielectric constant decreases as the crystallinity including orientation of the thin film is improved in the case of PZT as well similarly to the case of $PbTiO_3$. In other words, the fact that the relative dielectric constant $\varepsilon_r$ of the film structure 10 decreases to 450 or less indicates that the piezoelectric film 15 which is a piezoelectric film containing lead zirconate titanate is a single crystal film.

Suitably, in a case in which the film structure 10 includes the conductive film 18, $\varepsilon_r$ of the piezoelectric film 15 satisfies the equation (Math. 2) where $\varepsilon_r$ denotes the relative dielectric constant of the piezoelectric film 15 measured by applying an alternating-current voltage having a frequency of 1 kHz to between the conductive film 13 and the conductive film 18. As the relative dielectric constant at an alternating-current voltage having such a frequency decreases, for example, it is possible to increase the clock frequency of the detection circuit and to improve the response speed of the pressure sensor utilizing the film structure 10.

In a case in which the film structure 10 includes the conductive film 18, a ferroelectric capacitor CP1 is formed by the conductive film 13, the piezoelectric film 15, and the conductive film 18. Moreover, $\varepsilon_r$ of the piezoelectric film 15 is calculated based on the capacitance of the ferroelectric capacitor CP1 when an alternating-current voltage having a frequency of 1 kHz is applied to between the conductive film 13 and the conductive film 18.

Suitably, $P_r$ satisfies the following equation (Math. 3) where $P_r$ denotes the remanent polarization value of the piezoelectric film 15.

$$P_r \geq 28\ \mu C/cm^2 \qquad \text{(Math. 3)}$$

The remanent polarization value is a value to be an index of the ferroelectric properties of a piezoelectric material that is also a ferroelectric material. Generally, a piezoelectric film exhibiting excellent ferroelectric properties also exhibits excellent piezoelectric properties. Consequently, as $P_r$ of the piezoelectric film 15 satisfies the equation (Math. 3), the ferroelectric properties of the piezoelectric film 15 can be improved, and thus the piezoelectric properties of the piezoelectric film 15 can also be improved.

Incidentally, $P_r$ preferably satisfies $P_r \geq 40\ \mu C/cm^2$, more preferably satisfies $P_r \geq 50\ \mu C/cm^2$, and still more preferably satisfies $P_r \geq 55\ \mu C/cm^2$. As the value of $P_r$ increases, the ferroelectric properties of the piezoelectric film 15 can be further improved, and thus the piezoelectric properties of the piezoelectric film 15 can also be further improved.

In a case in which the film structure 10 includes the conductive film 18, the polarization value when the voltage applied to between the conductive film 13 and the conductive film 18 is raised from 0 to the positive side and returned to 0 again is the remanent polarization value $P_r$ of the piezoelectric film 15 when measuring a polarization voltage hysteresis curve (see FIG. 9 to be described later) indicating a change in polarization of the piezoelectric film 15 when a voltage applied to between the conductive film 13 and the conductive film 18 is changed. In addition, the polarization value when the voltage applied to between the conductive film 13 and the conductive film 18 is lowered from 0 to the negative side and returned to 0 again is the remanent polarization value $-P_r$ of the piezoelectric film 15.

In other words, the polarization when the voltage applied to the piezoelectric film 15 is raised from 0 to the positive side and returned to 0 again is the remanent polarization value $P_r$ of the piezoelectric film 15 when measuring a polarization electric field hysteresis curve indicating a change in polarization of the piezoelectric film 15 when the electric field applied to the piezoelectric film 15 is changed. In addition, the polarization when the electric field applied to the piezoelectric film 15 is lowered from 0 to the negative side and returned to 0 again is the remanent polarization value $-P_r$ of the piezoelectric film 15.

In a case in which the film structure 10 includes the conductive film 18, the ferroelectric capacitor CP1 is formed by the conductive film 13, the piezoelectric film 15, and the conductive film 18 as illustrated in FIG. 2. In such a case, $P_r$ of the piezoelectric film 15 is the remanent polarization value of the ferroelectric capacitor CP1.

Suitably, the piezoelectric film 15 includes a piezoelectric film 16 and a piezoelectric film 17. The piezoelectric film 16 contains a composite oxide composed of lead zirconate titanate formed on the film 14. The piezoelectric film 17 contains a composite oxide composed of lead zirconate titanate formed on the piezoelectric film 16. The piezoelectric film 16 has a compressive stress, and the piezoelectric film 17 has a tensile stress.

A case is considered in which the piezoelectric film 16 has a tensile stress and the piezoelectric film 17 has a tensile stress. In such a case, the film structure 10 is likely to warp so as to have a downward convex shape when the upper surface 11a of the substrate 11 is taken as a main surface. Hence, the shape accuracy decreases, for example, in a case in which the film structure 10 is processed by a photolithography technology, and the properties of the piezoelectric element formed by processing the film structure 10 deteriorate.

In addition, a case is considered in which the piezoelectric film 16 has a compressive stress and the piezoelectric film 17 has a compressive stress. In such a case, the film structure 10 is likely to warp so as to have an upward convex shape when the upper surface 11a of the substrate 11 is taken as a main surface. Hence, the shape accuracy decreases, for example, in a case in which the film structure 10 is processed by a photolithography technology, and the properties of the piezoelectric element formed by processing the film structure 10 deteriorate.

On the other hand, in the present embodiment, the piezoelectric film 16 has a compressive stress and the piezoelectric film 17 has a tensile stress. This makes it possible to decrease the amount of warpage of the film structure 10 as compared with the case in which the piezoelectric film 16 and the piezoelectric film 17 both have a tensile stress and to decrease the amount of warpage of the film structure 10 as compared with the case in which the piezoelectric film 16 and the piezoelectric film 17 both have a compressive stress. Hence, it is possible to improve the shape accuracy, for example, in a case in which the film structure 10 is processed by a photolithography technology and to improve the properties of the piezoelectric element formed by processing the film structure 10.

Incidentally, the fact that the piezoelectric film 16 has a compressive stress and the piezoelectric film 17 has a tensile stress can be confirmed by the fact that the substrate 11 is deformed from the downward convex side to the upward convex side before and after the removal of the piezoelectric film 17 and the substrate 11 is deformed from the upward convex side to the downward convex side before and after the removal of the piezoelectric film 16, for example, when the piezoelectric film 17 and the piezoelectric film 16 are sequentially removed from the film structure 10.

Suitably, the piezoelectric film 16 contains a composite oxide that is represented by the following general formula (Chem. 4) and composed of lead zirconate titanate (PZT).

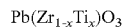

$$Pb(Zr_{1-x}Ti_x)O_3 \qquad \text{(Chem.4)}$$

Here, x satisfies $0.32 \leq x \leq 0.52$. Incidentally, the general formula (Chem. 4) represents the same composite oxide as that represented by the general formula (Chem. 1).

Among these, in a case in which x satisfies $0.32 \leq x \leq 0.48$, PZT contained in the piezoelectric film 16 originally has a composition to have a rhombohedral crystal structure but is likely to have a tetragonal crystal structure and to be (001)-oriented mainly by the binding force from the substrate 11, and the like. Moreover, the piezoelectric film 16 containing PZT is epitaxially grown on the film 14. Incidentally, in a case in which x satisfies $0.48 < x \leq 0.52$, PZT contained in the piezoelectric film 16 originally has a composition to have a tetragonal crystal structure and thus has a tetragonal crystal structure and is (001)-oriented. Moreover, the piezoelectric film 16 containing PZT is epitaxially grown on the film 14. This makes it possible to orient the polarization axis of lead zirconate titanate contained in the piezoelectric film 16 to be substantially perpendicular to the upper surface 11a, and it is thus possible to improve the piezoelectric properties of the piezoelectric film 16.

In addition, the piezoelectric film 17 suitably contains a composite oxide that is represented by the following general formula (Chem. 5) and composed of lead zirconate titanate (PZT).

$$Pb(Zr_{1-y}Ti_y)O_3 \quad \text{(Chem.5)}$$

Here, y satisfies $0.32 \leq y \leq 0.52$.

Among these, in a case in which y satisfies $0.32 \leq y \leq 0.48$, PZT contained in the piezoelectric film 17 originally has a composition to have a rhombohedral crystal structure but is likely to have a tetragonal crystal structure and to be (001)-oriented mainly by the binding force from the substrate 11, and the like. Moreover, the piezoelectric film 17 containing PZT is epitaxially grown on the piezoelectric film 16. Incidentally, in a case in which y satisfies $0.48 < y \leq 0.52$, PZT contained in the piezoelectric film 17 originally has a composition to have a tetragonal crystal structure and thus has a tetragonal crystal structure and is (001)-oriented. Moreover, the piezoelectric film 17 containing PZT is epitaxially grown on the piezoelectric film 16. This makes it possible to orient the polarization axis of lead zirconate titanate contained in the piezoelectric film 17 to be substantially perpendicular to the upper surface 11a, and it is thus possible to improve the piezoelectric properties of the piezoelectric film 17.

As will be described later with reference to FIG. 15, the piezoelectric film 16 having a compressive stress can be formed by, for example, a sputtering method. In addition, when the manufacturing process of the film structure is described, the piezoelectric film 17 having a tensile stress can be formed by, for example, a coating method such as a sol-gel method as described with reference to FIG. 1.

Figure 8:
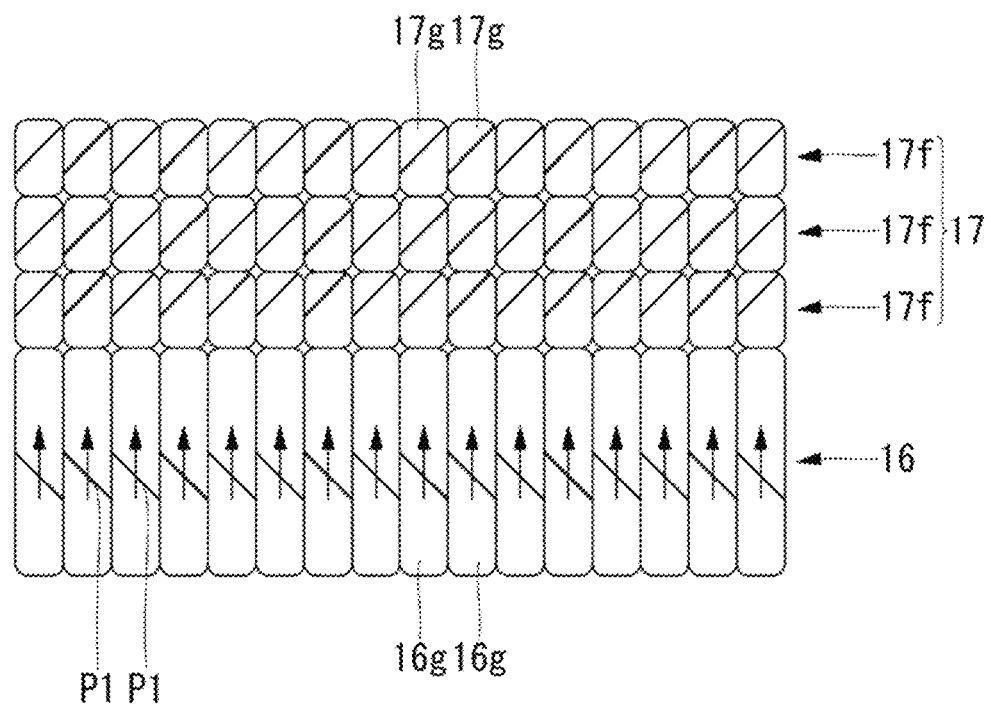
FIG. 8 is a diagram schematically illustrating a cross-sectional structure of two piezoelectric films included in a film structure according to an embodiment.

FIG. 8 is a diagram schematically illustrating a cross-sectional structure of two piezoelectric films included in a film structure according to an embodiment. FIG. 8 schematically illustrates the piezoelectric film 16 and the piezoelectric film 17 in an observation image attained by observing a cross section formed by cleaving the substrate 11 included in the film structure 10 according to the embodiment illustrated in FIG. 1, namely a fracture surface, under a scanning electron microscope (SEM).

Figure 9:
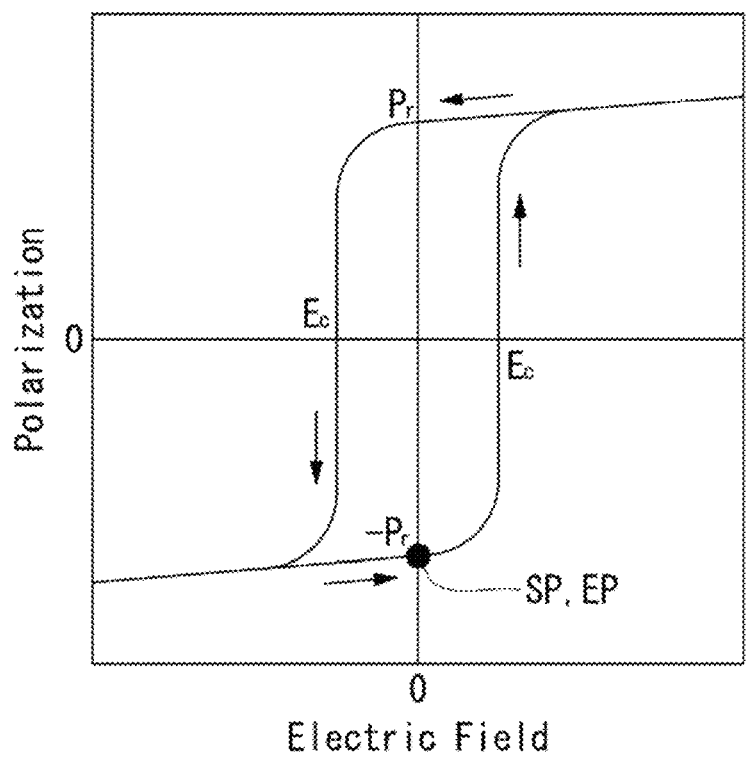
FIG. 9 is a graph schematically illustrating electric field dependency of polarization of a piezoelectric film included in a film structure according to an embodiment.

FIG. 9 is a graph schematically illustrating the electric field dependency of polarization of a piezoelectric film included in a film structure according to an embodiment. FIG. 9 is a graph schematically illustrating a polarization electric field hysteresis curve indicating a change in the polarization of the piezoelectric film 15 when the electric field between the lower electrode (conductive film 13) and the upper electrode (conductive film 18) which are included in the film structure 10 according to the embodiment illustrated in FIG. 2 is changed.

As illustrated in FIG. 8, the piezoelectric film 16 includes a plurality of crystal grains 16g each integrally formed from the lower surface to the upper surface of the piezoelectric film 16 in a case in which the piezoelectric film 16 is formed by a sputtering method. In addition, holes or voids are less likely to remain between two crystal grains 16g adjacent to each other in the main surface (the upper surface 11a in FIG. 1) of the substrate 11. Hence, in a case in which the cross section for observation under SEM is formed on the piezoelectric film 16 through processing by a focused ion beam (FIB) method, the cross section is likely to be seen as a single cross section and the crystal grains 16g are less likely to be observed.

On the other hand, in a case in which the piezoelectric film 17 is formed by a coating method, the piezoelectric film 17 includes a plurality of films 17f as layers laminated one over another in the thickness direction of the piezoelectric film 17. The film 17f as each of the plurality of layers contains a plurality of crystal grains 17g each integrally formed from the lower surface to the upper surface of the film 17f of one layer. In addition, holes or voids remain between two films 17f adjacent to each other in the thickness direction of the piezoelectric film 17 in some cases.

As illustrated in FIG. 8, each of the plurality of crystal grains suitably has spontaneous polarization. This spontaneous polarization includes a polarization component P1 parallel to the thickness direction of the piezoelectric film 16, and the polarization components P1 included in the spontaneous polarization of each of the plurality of crystal grains face the same direction as each other.

In such a case, the piezoelectric film 15 has great spontaneous polarization in the initial state as illustrated in FIG. 9. Hence, the hysteresis curve indicating the electric field dependency of polarization of the piezoelectric film 15 in a case in which the electric field is raised from a start point SP of 0 to the positive side and returned to 0 again and then the electric field is lowered to the negative side and returned to an end point EP of 0 again is a curve in which a point away from the origin is taken as the start point SP. Consequently, in a case in which the film structure 10 according to the present embodiment is used as a piezoelectric element, the piezoelectric film 15 is not required to be subjected to a polarization treatment before being used.

Incidentally, the electric field value when the hysteresis curve illustrated in FIG. 9 intersects the electric field axis, that is, when the polarization is 0, is referred to as a coercive electric field value $E_c$. In addition, when the voltage dependency of polarization is displayed instead of the electric field dependency of polarization in the graph of the hysteresis curve, the voltage value when the hysteresis curve intersects the voltage axis, that is, when the polarization is 0, is referred to as a coercive voltage value $V_c$.

Figure 10:
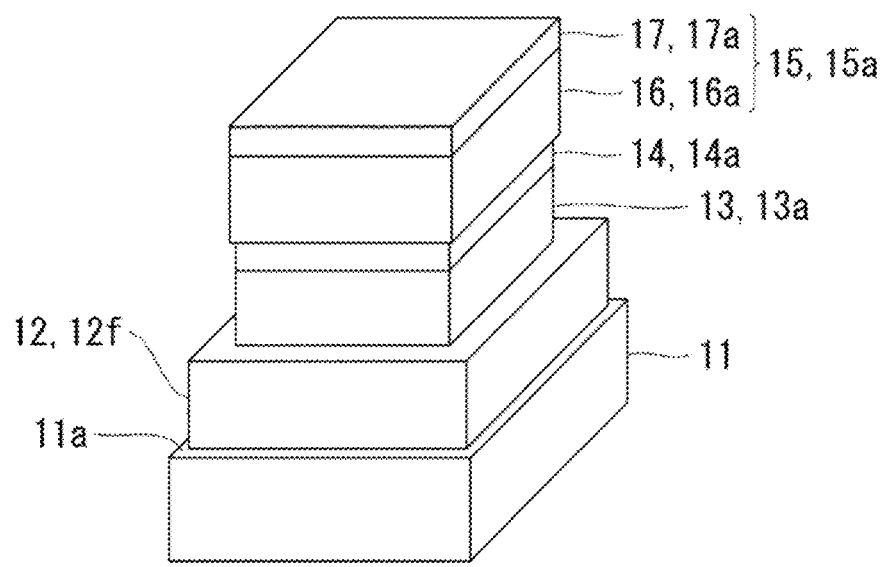
FIG. 10 is a diagram illustrating a state in which films of the respective layers included in a film structure according to an embodiment have been epitaxially grown.

FIG. 10 is a diagram illustrating a state in which films of the respective layers included in a film structure according to an embodiment have been epitaxially grown. Incidentally, the respective layers of the substrate 11, the alignment film 12, the conductive film 13, the film 14, and the piezoelectric film 15 are schematically illustrated in FIG. 10.

The lattice constant of Si contained in the substrate 11, the lattice constant of $ZrO_2$ contained in the alignment film 12, the lattice constant of Pt contained in the conductive film 13, the lattice constant of SRO contained in the film 14, and the lattice constant of PZT contained in the piezoelectric film 15 are presented in Table 1.

TABLE 1

| Material | Lattice constant (nm) |
| --- | --- |
| PZT | 0.411 |
| SRO | 0.390 to 0.393 |
| Pt | 0.392 (0.554) |
| $ZrO_2$ | 0.511 |
| Si | 0.543 |

As presented in Table 1, the lattice constant of Si is 0.543 nm, the lattice constant of $ZrO_2$ is 0.511 nm, and the mismatch between the lattice constant of $ZrO_2$ and the lattice constant of Si is as small as 6.1%, and thus the matching property between the lattice constant of $ZrO_2$ and the lattice constant of Si is favorable. Hence, as illustrated in FIG. 10, the alignment film 12 containing $ZrO_2$ can be epitaxially grown on the upper surface 11a as the main surface composed of the (100) plane of the substrate 11 containing silicon single crystal. Consequently, the alignment film 12 containing ZrO$_2$ can be (100)-oriented in a cubic crystal structure on the (100) plane of the substrate 11 containing silicon single crystal, and the crystallinity of the alignment film 12 can be improved.

It is assumed that the alignment film 12 includes a zirconium oxide film 12f which has a cubic crystal structure and is (100)-oriented. In such a case, the zirconium oxide film 12f is oriented so that the <100> direction of the zirconium oxide film 12f, which is a direction along the upper surface 11a as the main surface of the substrate 11 composed of a silicon substrate, is parallel to the <100> direction of the substrate 11 itself, which is a direction along the upper surface 11a.

Incidentally, the fact that the <100> direction of the zirconium oxide film 12f, which is a direction along the upper surface 11a of the substrate 11, is parallel to the <100> direction of the substrate 11 itself composed of a silicon substrate, which is a direction along the upper surface 11a, includes not only a case in which the <100> direction of the zirconium oxide film 12f is completely parallel to the <100> direction of the substrate 11 itself, which is a direction along the upper surface 11a, but also a case in which the angle formed by the <100> direction of the zirconium oxide film 12f and the <100> direction of the substrate 11 itself, which is a direction along the upper surface 11a, is 20° or less. In addition, the same applies to the in-plane orientation of the films of other layers as well as the zirconium oxide film 12f.

On the other hand, as presented in Table 1, the lattice constant of ZrO$_2$ is 0.511 nm and the lattice constant of Pt is 0.392 nm, but the length of the diagonal line is 0.554 nm and the mismatch between the length of the diagonal line and the lattice constant of ZrO$_2$ is as small as 8.1% when Pt is rotated by 45° in the plane, and it is thus considered that the conductive film 13 containing Pt can be epitaxially grown on the (100) plane of the alignment film 12 containing ZrO$_2$. For example, Patent Literature 2 and Non Patent Literature 1 report that a LSCO film is oriented so that the <100> direction in the plane of the LSCO film composed of LSCO having a lattice constant (0.381 nm) equal to the lattice constant of Pt is parallel to the <110> direction in the main surface of the silicon substrate although the LSCO film is not a Pt film.

However, the present inventors have found out for the first time that the conductive film 13 containing Pt can be epitaxially grown on a silicon substrate without rotating Pt by 45° in the plane although the mismatch between the lattice constant of Pt and the lattice constant of ZrO$_2$ is as large as 26%. In other words, it is assumed that the conductive film 13 includes a platinum film 13a which has a cubic crystal structure and is (100)-oriented. In such a case, the platinum film 13a is oriented so that the <100> direction of the platinum film 13a, which is a direction along the upper surface 11a of the substrate 11 composed of a silicon substrate, is parallel to the <100> direction of the substrate 11 itself, which is a direction along the upper surface 11a. In this manner, it has been demonstrated that the conductive film 13 containing Pt can be (100)-oriented in a cubic crystal structure on the (100) plane of the alignment film 12 containing ZrO$_2$ and the crystallinity of the conductive film 13 can be improved.

Incidentally, by adjusting the conditions when forming ZrO$_2$ or the conditions when forming Pt, the conductive film 13 containing Pt can also be epitaxially grown on the (100) plane of the alignment film 12 containing ZrO$_2$ in a state in which Pt is rotated by 45° in the plane, that is, in a state in which the <100> direction of Pt is along the <110> direction of Si in the main surface of the substrate 11.

In addition, as presented in Table 1, the lattice constant of Pt is 0.392 nm, the lattice constant of SRO is 0.390 to 0.393 nm, and the mismatch between the lattice constant of PZT and the lattice constant of Pt is as small as 0.5% or less, and thus the matching property between the lattice constant of SRO and the lattice constant of Pt is favorable. Hence, as illustrated in FIG. 10, the film 14 containing SRO can be epitaxially grown on the (100) plane of the conductive film 13 containing Pt. Consequently, the film 14 containing SRO can be (100)-oriented in pseudo-cubic crystal display on the (100) plane of the conductive film 13 containing Pt, and the crystallinity of the film 14 can be improved.

It is assumed that the film 14 includes a SRO film 14a which has a pseudo-cubic crystal structure and is (100)-oriented. In such a case, the SRO film 14a is oriented so that the <100> direction of the SRO film 14a, which is a direction along the upper surface 11a of the substrate 11 composed of a silicon substrate, is parallel to the <100> direction of the substrate 11 itself, which is a direction along the upper surface 11a.

In addition, as presented in Table 1, the lattice constant of SRO is 0.390 to 0.393 nm, the lattice constant of PZT is 0.411 nm, and the mismatch between the lattice constant of PZT and the lattice constant of SRO is as small as 4.5% to 5.2%, and thus the matching property between the lattice constant of PZT and the lattice constant of SRO is favorable. Hence, as illustrated in FIG. 10, the piezoelectric film 15 containing PZT can be epitaxially grown on the (100) plane of the film 14 containing SRO. Consequently, the piezoelectric film 15 containing PZT can be (001)-oriented in tetragonal crystal display or (100)-oriented in pseudo-cubic crystal display on the (100) plane of the film 14 containing SRO, and the crystallinity of the piezoelectric film 15 can be improved.

It is assumed that the piezoelectric film 15 includes a lead zirconate titanate film 15a which has a tetragonal crystal structure and is (001)-oriented. In such a case, the lead zirconate titanate film 15a is oriented so that the <100> direction of the lead zirconate titanate film 15a, which is a direction along the upper surface 11a of the substrate 11 composed of a silicon substrate, is parallel to the <100> direction of the substrate 11 itself, which is a direction along the upper surface 11a.

In this manner, the present inventors have found out for the first time that the piezoelectric film 15 containing lead zirconate titanate can be epitaxially grown on a silicon substrate without rotating lead zirconate titanate by 45° in the plane. This is completely different relation from, for example, the relation of in-plane orientation described in Patent Literature 2 and Non Patent Literature 1.

Incidentally, a film containing lead zirconate titanate may be formed between the film 14 and the piezoelectric film 15. The film may contain a composite oxide that is represented by the following general formula (Chem. 6) and (100)-oriented in pseudo-cubic crystal display.

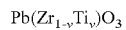 (Chem.6)

Here, v satisfies 0≤v≤0.1.

By this, the piezoelectric film 15 containing PZT can be more easily (001)-oriented in tetragonal crystal display or (100)-oriented in pseudo-cubic crystal display on the (100) plane of the film 14 containing SRO, and the crystallinity of the piezoelectric film 15 can be more easily improved.

Figure 11:
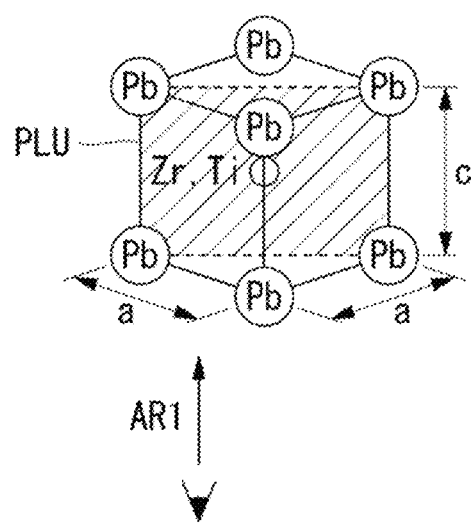
FIG. 11 is a diagram schematically illustrating a unit lattice of PZT.

FIG. 11 is a diagram schematically illustrating a unit lattice of PZT. FIG. 11 illustrates lead (Pb), zirconium (Zr), or titanium (Ti) among the elements contained in the unit lattice of PZT contained in the piezoelectric film 15.

As illustrated in FIG. 11, when PZT contained in the piezoelectric film 15 is (001)-oriented in tetragonal crystal display, that is, c-axis oriented, the lattice constant ratio of the lattice constant c in the c-axis direction of tetragonal PZT to the lattice constant a in the a-axis direction of tetragonal PZT is suitably 1.010 to 1.016.

The lattice constant ratio (c/a ratio) of the lattice constant c in the c-axis direction of ordinary tetragonal PZT to the lattice constant a in the a-axis direction of ordinary tetragonal PZT is less than 1.010. On the other hand, the c/a ratio of tetragonal PZT in the piezoelectric film 15 included in the film structure of the present embodiment is 1.010 or more. In addition, the piezoelectric properties of tetragonal PZT depend on the c/a ratio of tetragonal PZT. Hence, according to the piezoelectric film 15 included in the film structure of the present embodiment, it is possible to realize a piezoelectric film exhibiting piezoelectric properties superior to those of ordinary PZT. Incidentally, the lattice constant ratio of the lattice constant c in the c-axis direction of tetragonal PZT to the lattice constant a in the a-axis direction of tetragonal PZT may be 1.010 to 1.016 in the piezoelectric film 16 of the piezoelectric film 15.

<Method for Manufacturing Film Structure>

Next, a method for manufacturing the film structure according to the present embodiment will be described. FIGS. 12 to 15 are cross-sectional views of a film structure according to an embodiment in the manufacturing process thereof.

Figure 12:
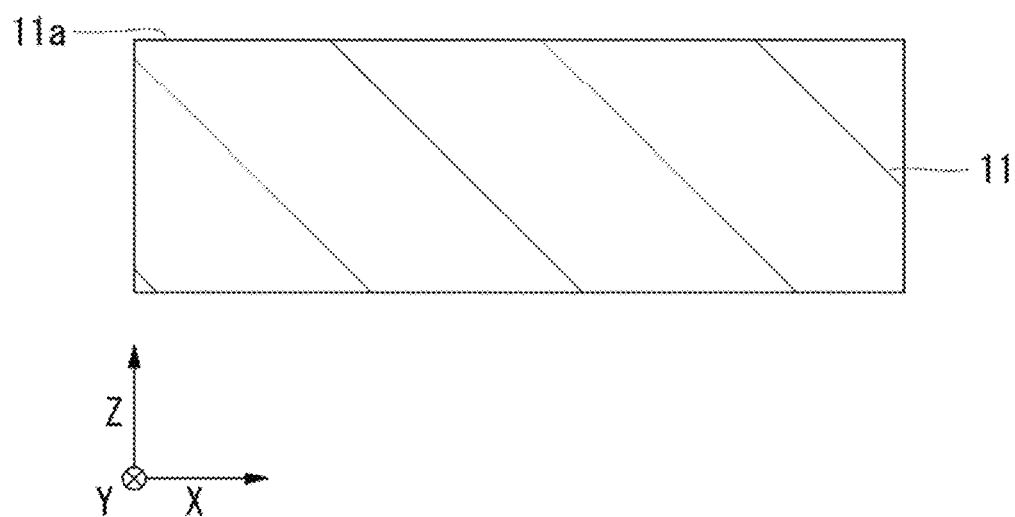
FIG. 12 is a cross-sectional view of a film structure according to an embodiment in a manufacturing process thereof.

First, the substrate 11 is prepared (step S1) as illustrated in FIG. 12. In step S1, a substrate 11, which is a silicon substrate composed of, for example, silicon (Si) single crystal, is prepared. The substrate 11 composed of silicon single crystal has a cubic crystal structure and has the upper surface 11a as a main surface, which is composed of a (100) plane. In a case in which the substrate 11 is a silicon substrate, an oxide film such as a $SiO_2$ film may be formed on the upper surface 11a of the substrate 11.

Incidentally, as the substrate 11, various substrates other than a silicon substrate can be used, and for example, a SOI (silicon on insulator) substrate, a substrate composed of various semiconductor single crystals other than silicon, a substrate composed of various oxide single crystals such as sapphire, a substrate composed of a glass substrate having a surface on which a polysilicon film is formed, or the like can be used.

As illustrated in FIG. 12, two directions orthogonal to each other in the upper surface 11a composed of the (100) plane of the substrate 11 composed of silicon single crystal are defined as an X-axis direction and a Y-axis direction and a direction perpendicular to the upper surface 11a is defined as a Z-axis direction.

Figure 13:
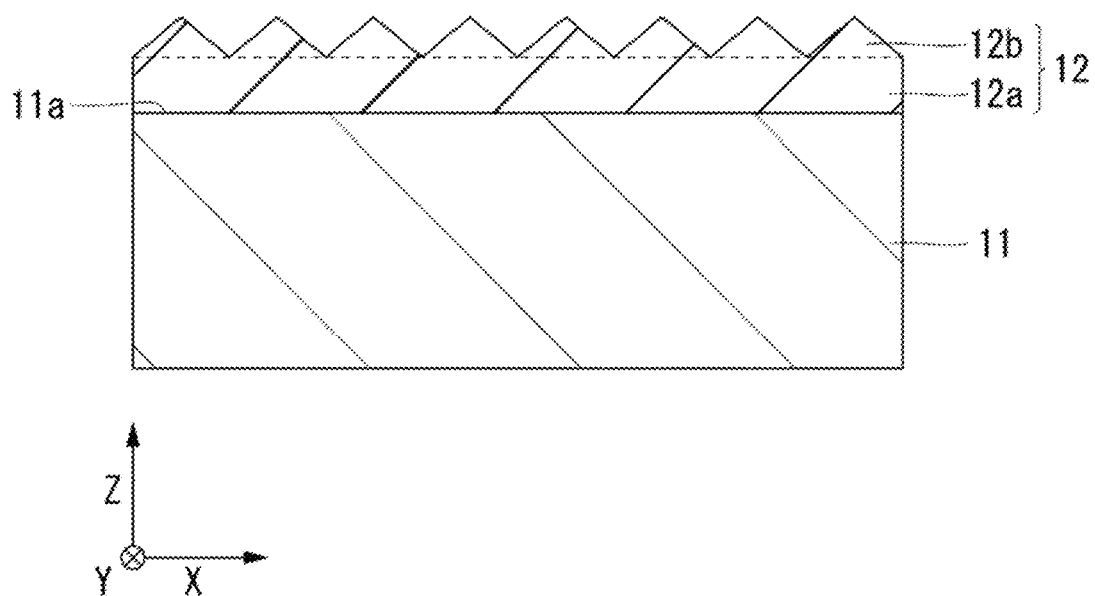
FIG. 13 is a cross-sectional view of a film structure according to an embodiment in a manufacturing process thereof.

Next, the alignment film 12 is formed on the substrate 11 (step S2) as illustrated in FIG. 13. Hereinafter, a case in which the alignment film 12 is formed by an electron beam evaporation method in step S2 will be described as an example, but the alignment film 12 can be formed by, for example, various methods such as a sputtering method.

In step S2, the substrate 11 is first heated to, for example, 700° C. in a state of being disposed in a constant vacuum atmosphere.

In step S2, Zr is next evaporated by an electron beam evaporation method using an evaporation material of zirconium (Zr) single crystal. At this time, the evaporated Zr reacts with oxygen on the substrate 11 heated to, for example, 700° C. to form a zirconium oxide ($ZrO_2$) film.

Thereafter, the alignment film 12 composed of a $ZrO_2$ film as a single-layer film is formed.

The alignment film 12 is epitaxially grown on the upper surface 11a as the main surface composed of the (100) plane of the substrate 11 composed of silicon single crystal. The alignment film 12 contains zirconium oxide ($ZrO_2$) that has a cubic crystal structure and is (100)-oriented. In other words, the alignment film 12 composed of a single-layer film containing (100)-oriented zirconium oxide ($ZrO_2$) is formed on the upper surface 11a composed of the (100) plane of the substrate 11 composed of silicon single crystal.

As described with reference to FIG. 12 above, two directions orthogonal to each other in the upper surface 11a of the (100) plane of the substrate 11 composed of silicon single crystal are defined as an X-axis direction and a Y-axis direction and a direction perpendicular to the upper surface 11a is defined as a Z-axis direction. At this time, the fact that a certain film is epitaxially grown means that the film is oriented in any direction of the X-axis direction, the Y-axis direction, or the Z-axis direction.

It is assumed that the alignment film 12 includes a zirconium oxide film 12f which has a cubic crystal structure and is (100)-oriented (see FIG. 10). In such a case, the zirconium oxide film 12f is oriented so that the <100> direction of the zirconium oxide film 12f, which is a direction along the upper surface 11a as the main surface of the substrate 11 composed of a silicon substrate, is parallel to the <100> direction of the substrate 11 itself, which is a direction along the upper surface 11a.

As illustrated in FIG. 13, the alignment film 12 suitably includes the film portion 12a formed on the upper surface 11a of the substrate 11 and the plurality of protrusion portions 12b each protruded from the upper surface of the film portion 12a. In addition, the film portion 12a contains zirconium oxide (zirconium oxide film) that has a cubic crystal structure and is (100)-oriented. Moreover, each of the plurality of protrusion portions 12b contains zirconium oxide (zirconium oxide film) that has a cubic crystal structure and is (100)-oriented.

By this, the interface roughness (roughness) of the interface IF1 (see FIG. 4) between the alignment film 12 and the conductive film 13 (see FIG. 4) to be formed in step S3 to be described later increases and the average interface roughness of the interface IF1 between the alignment film 12 and the conductive film 13 is greater than the average interface roughness of the interface IF2 (see FIG. 4) between the substrate 11 and the alignment film 12. Hence, for example, the surface of the alignment film 12 becomes a surface other than the (100) plane of the zirconium oxide film included in the alignment film 12, and the platinum film is likely to be epitaxially grown on the surface of the zirconium oxide film as a surface other than the (100) plane of the platinum film included in the conductive film 13 is epitaxially grown on the surface other than the (100) plane of the zirconium oxide film, and the like. Moreover, the conductive film 13 including the platinum film is likely to be epitaxially grown, thus the film 14 and the piezoelectric film 15 are likely to be epitaxially grown, and as a result, the piezoelectric properties of the piezoelectric film 15 can be improved.

Alternatively, it is only required that the average interface roughness of the interface IF1 between the alignment film 12 and the conductive film 13 is greater than the average interface roughness of the interface IF2 between the substrate 11 and the alignment film 12, and thus the alignment film 12 need not clearly have the plurality of protrusion portions 12b or may have, for example, a step-terrace structure having a plurality of steps (steps) formed on the surface so as to be separated from each other in plan view.

Suitably, the cross-sectional shape of the protrusion portion 12b perpendicular to the first direction along the upper surface 11a of the substrate 11 is a triangular shape and the width of the protrusion portion 12b in the second direction that is a direction which is along the upper surface 11a of the substrate 11 and perpendicular to the first direction decreases from the film portion 12a side, namely, the substrate 11 side toward the side opposite to the film portion 12a side, namely, the side opposite to the substrate 11 side. In a case in which the protrusion portion 12b has such a triangular shape, the platinum film included in the conductive film 13 is more likely to be epitaxially grown on the surface of the zirconium oxide film included in the alignment film 12.

Suitably, a thickness TH1 of the film portion 12a (see FIG. 5) is 11 to 18 nm and the protrusion height HT1 (see FIG. 5) of each of the plurality of protrusion portions 12b protruded from an upper surface 12c (see FIG. 5) of the film portion 12a is 4 to 8 nm. In other words, a thickness TH2 (see FIG. 5) of the alignment film 12 is suitably 13 to 22 nm.

In a case in which the protrusion height HT1 of the protrusion portion 12b is 4 nm or more, the average interface roughness of the interface IF1 can be surely increased to be greater than the average interface roughness of the interface IF2 as compared with a case in which the protrusion height HT1 of the protrusion portion 12b is less than 4 nm, and thus platinum contained in the conductive film 13 formed on the alignment film 12 containing (100)-oriented zirconium oxide is likely to be (100)-oriented. Meanwhile, in a case in which the protrusion height HT1 of the protrusion portion 12b is 8 nm or less, the average interface roughness of the interface IF1 is not too great as compared with a case in which the protrusion height HT1 of the protrusion portion 12b exceeds 8 nm, and thus the flatness of the conductive film 13 formed on the alignment film 12 containing (100)-oriented zirconium oxide can be improved.

In addition, in a case in which the thickness TH1 of the film portion 12a is 11 nm or more, the thickness TH2 of the alignment film 12 is thick to a certain extent as compared with a case in which the thickness TH1 of the film portion 12a is less than 11 nm, thus the alignment film 12 is uniformly formed over the entire upper surface 11a of the substrate 11 and direct contact between the conductive film 13 and the substrate 11 can be prevented. In addition, in a case in which the thickness TH1 of the film portion 12a is 11 nm or more, the thickness TH2 of the alignment film 12 is thick to a certain extent as compared with a case in which the thickness TH1 of the film portion 12a is less than 11 nm, thus the protrusion height HT1 of the protrusion portion 12b is likely to be set to 4 nm or more and platinum contained in the conductive film 13 is likely to be (100)-oriented. Meanwhile, in a case in which the thickness TH1 of the film portion 12a is 18 nm or less, the average interface roughness of the interface IF1 is not too great as compared with a case in which the thickness TH1 of the film portion 12a exceeds 18 nm, and thus the flatness of the conductive film 13 formed on the alignment film 12 can be improved.

In other words, in a case in which the thickness TH2 of the alignment film 12 is 13 nm or more, the alignment film 12 is uniformly formed over the entire upper surface 11a of the substrate 11 and direct contact between the conductive film 13 and the substrate 11 can be prevented as compared with a case in which the thickness TH2 of the alignment film 12 is less than 13 nm. In addition, in a case in which the thickness TH2 of the alignment film 12 is 13 nm or more, the protrusion height HT1 of the protrusion portion 12b is likely to be set to 4 nm or more and platinum contained in the conductive film 13 is likely to be (100)-oriented as compared with a case in which the thickness TH2 of the alignment film 12 is less than 13 nm. Meanwhile, in a case in which the thickness TH2 of the alignment film 12 is 22 nm or less, the average interface roughness of the interface IF1 is not too great as compared with a case in which the thickness TH2 of the alignment film 12 exceeds 22 nm, and thus the flatness of the conductive film 13 formed on the alignment film 12 can be improved.

Next, the conductive film 13 is formed (step S3) as illustrated in FIG. 4.

In this step S3, the conductive film 13 as a part of a lower electrode, which is epitaxially grown on the alignment film 12, is first formed. The conductive film 13 is composed of a metal. As the conductive film 13 composed of a metal, for example, a conductive film containing platinum (Pt) is used.

In a case in which a conductive film containing Pt is formed as the conductive film 13, an epitaxially grown conductive film 13 is formed as a part of the lower electrode on the alignment film 12 at a temperature of 450° C. to 600° C. by a sputtering method. The conductive film 13 containing Pt is epitaxially grown on the alignment film 12. In addition, Pt contained in the conductive film 13 has a cubic crystal structure and is (100)-oriented.

It is assumed that the conductive film 13 includes a platinum film 13a which has a cubic crystal structure and is (100)-oriented (see FIG. 10). In such a case, the platinum film 13a is oriented so that the <100> direction of the platinum film 13a, which is a direction along the upper surface 11a of the substrate 11 composed of a silicon substrate, is parallel to the <100> direction of the substrate 11 itself, which is a direction along the upper surface 11a.

Incidentally, as the conductive film 13 composed of a metal, for example, a conductive film containing iridium (Ir) can be used instead of the conductive film containing platinum (Pt).

Suitably, the conductive film 13 which covers the plurality of protrusion portions 12b is formed and the conductive film 13 is embedded between two adjacent protrusion portions 12b in step S3. In a case in which the conductive film 13 has such a shape, the area of the interface between the conductive film 13 and the alignment film 12 increases and the adhesive force of the conductive film 13 to the alignment film 12 increases.

In the film structure illustrated in FIG. 4, suitably, the conductive film 13 has a tensile stress TS1 and the alignment film 12 has a compressive stress CS1 or a tensile stress TS2 weaker than the tensile stress TS1 as illustrated in FIG. 6.

First, as illustrated in FIG. 13, at the time point at which the alignment film 12 is formed on the substrate 11, the alignment film 12 has a tensile stress TS4 as described with reference to FIG. 7 above.

The linear expansion coefficient $\alpha_{ZrO2}$ of zirconium oxide ($ZrO_2$) is about $9 \times 10^{-6}$ °C.$^{-1}$, the linear expansion coefficient $\alpha_{Si}$ of silicon (Si) is about $4 \times 10^{-6}$ °C.$^{-1}$, and the linear expansion coefficient $\alpha_{ZrO2}$ of zirconium oxide is greater than the linear expansion coefficient $\alpha_{Si}$ of silicon (Si). In such a case, when the alignment film 12 composed of zirconium oxide is formed on the substrate 11 composed of silicon at a temperature of, for example, 550° C. and then the substrate 11 is cooled from 550° C. to room temperature (30° C.), the alignment film 12 shrinks along the upper surface 11a of the substrate 11 but the substrate 11 does not shrink as much as the alignment film 12, and thus the alignment film 12 is pulled by being bound to the substrate 11 and cannot completely shrink. As a result, the alignment film 12 has a tensile stress TS4, the substrate 11 has a compressive stress, and the substrate 11 is curved in a downward convex shape as illustrated in FIG. 7.

Meanwhile, the linear expansion coefficient $\alpha_{Pt}$ of platinum (Pt) is also about $9\times10^{-6}$ $°C.^{-1}$ and the linear expansion coefficient $\alpha_{Pt}$ of platinum (Pt) is also greater than the linear expansion coefficient $\alpha_{Si}$ of silicon (Si). In such a case, when the conductive film 13 composed of platinum is formed on the alignment film 12 at a temperature of, for example, 550° C. and then the substrate 11 is cooled from 550° C. to room temperature (30° C.), the conductive film 13 shrinks along the upper surface 11a of the substrate 11 but the substrate 11 does not shrink as much as the conductive film 13, and thus the conductive film 13 is pulled by being bound to the substrate 11 and cannot completely shrink. Hence, the conductive film 13 has a tensile stress TS1. In addition, the alignment film 12 is pulled from the substrate 11 but is compressed by the conductive film 13 or hardly receives force from the conductive film 13. Hence, the alignment film 12 has a compressive stress CS1 or a tensile stress TS2 weaker than the tensile stress TS1.

Incidentally, in a case in which the thickness of the conductive film 13 is thicker than the thickness of the alignment film 12, the alignment film 12 is compressed by the conductive film 13. Hence, the upper layer portion 12d of the alignment film 12 has a compressive stress CS2 and the lower layer portion 12e of the alignment film 12 has a tensile stress TS3 as illustrated in FIG. 6. Moreover, the compressive stress CS2 is stronger than the compressive stress CS1 when the alignment film 12 has a compressive stress CS1 as a whole, and the tensile stress TS3 is stronger than the tensile stress TS2 when the alignment film 12 has a tensile stress TS2 as a whole.

Figure 14:
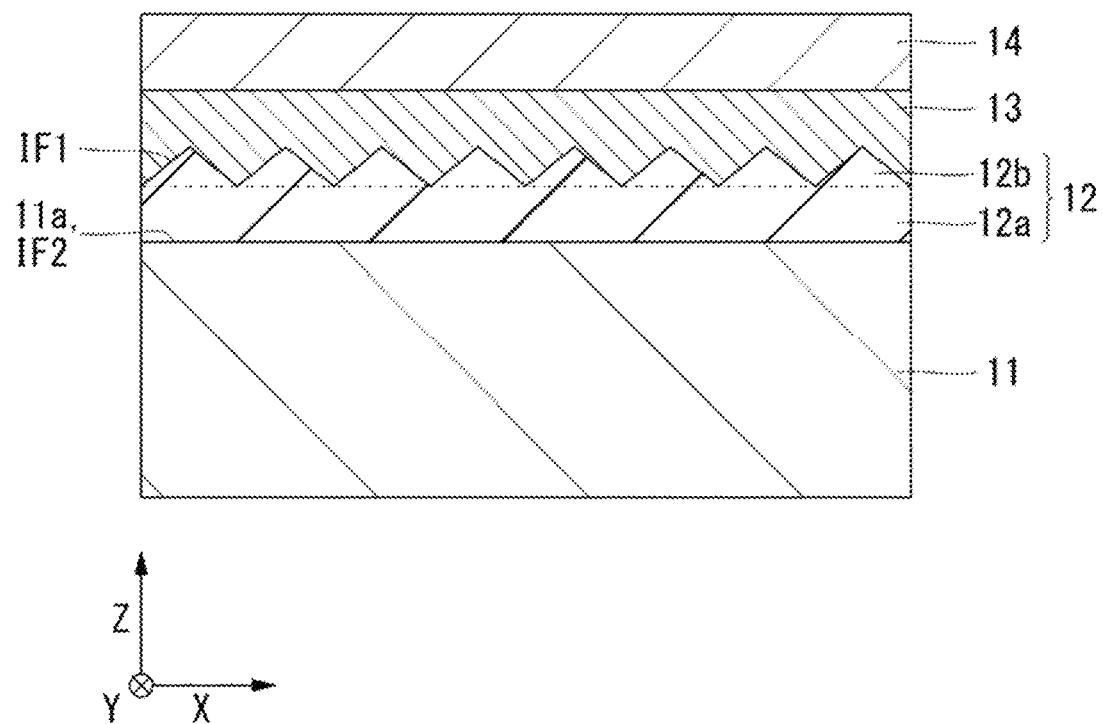
FIG. 14 is a cross-sectional view of a film structure according to an embodiment in a manufacturing process thereof.

Next, the film 14 is formed (step S4) as illustrated in FIG. 14. In this step S4, the film 14 containing the composite oxide represented by the general formula (Chem. 2) is formed on the conductive film 13. As the composite oxide represented by the general formula (Chem. 2), it is possible to form, for example, a conductive film containing strontium titanate (STO), strontium ruthenate titanate (STRO), or strontium ruthenate (SRO). In the case of forming a conductive film containing SRO as a composite oxide represented by the general formula (Chem. 2), the film 14 as a conductive film as a part of the lower electrode is formed on the conductive film 13 in step S4. Incidentally, in the general formula (Chem. 2), z satisfies $0 \le z \le 1$.

In the case of forming a conductive film containing STO, STRO, or SRO as the film 14, an epitaxially grown film 14 is formed as a part of the lower electrode on the conductive film 13 at a temperature of about 600° C. by a sputtering method. The film 14 containing STO, STRO, or SRO is epitaxially grown on the conductive film 13. In addition, STO, STRO, or SRO contained in the film 14 is (100)-oriented in pseudo-cubic crystal display or cubic crystal display.

It is assumed that the film 14 includes a SRO film 14a which has a pseudo-cubic crystal structure and is (100)-oriented (see FIG. 10). In such a case, the SRO film 14a is oriented so that the <100> direction of the SRO film 14a, which is a direction along the upper surface 11a of the substrate 11 composed of a silicon substrate, is parallel to the <100> direction of the substrate 11 itself, which is a direction along the upper surface 11a.

In addition, the film 14 can be formed by a coating method such as a sol-gel method instead of the sputtering method. In such a case, a solution containing strontium and ruthenium, strontium, titanium and ruthenium, or strontium and titanium is first applied onto the film 14 to form a film containing a precursor of the composite oxide represented by the general formula (Chem. 2) in step S4. In addition, in the case of forming the film 14 by a coating method, next, the film is subjected to a heat treatment to oxidize and crystallize the precursor, whereby the film 14 containing a composite oxide represented by the general formula (Chem. 2) is formed in step S4.

Figure 15:
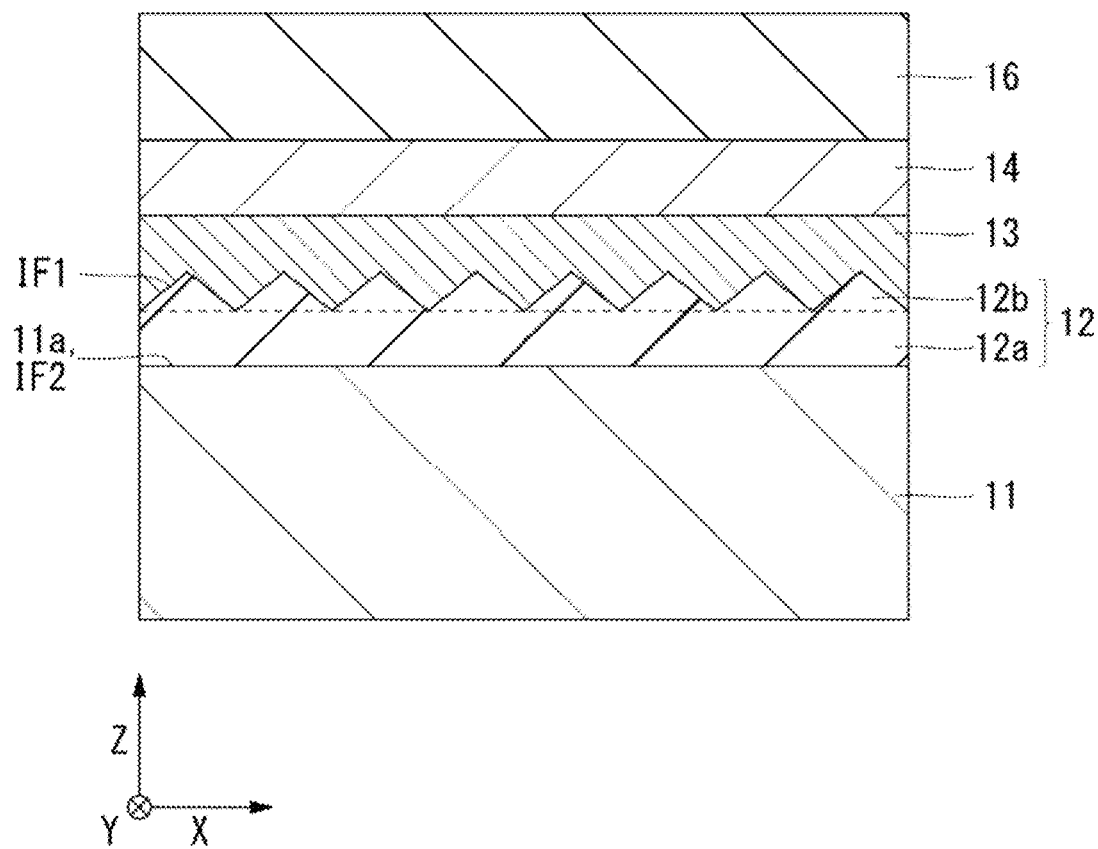
FIG. 15 is a cross-sectional view of a film structure according to an embodiment in a manufacturing process thereof.

Next, the piezoelectric film 16 is formed (step S5) as illustrated in FIG. 15. In this step S5, the piezoelectric film 16 containing a composite oxide that is represented by the general formula (Chem. 4) and composed of lead zirconate titanate (PZT) is formed on the film 14 by a sputtering method. Here, in the general formula (Chem. 4), x satisfies $0.32 \le x \le 0.52$.

Among these, in a case in which x satisfies $0.32 \le x \le 0.48$, PZT contained in the piezoelectric film 16 originally has a composition to have a rhombohedral crystal structure but is likely to have a tetragonal crystal structure and to be (001)-oriented mainly by the binding force from the substrate 11, and the like. Moreover, the piezoelectric film 16 containing PZT is epitaxially grown on the film 14. Incidentally, in a case in which x satisfies $0.48 < x \le 0.52$, PZT contained in the piezoelectric film 16 originally has a composition to have a tetragonal crystal structure and thus has a tetragonal crystal structure and is (001)-oriented. Moreover, the piezoelectric film 16 containing PZT is epitaxially grown on the film 14. This makes it possible to orient the polarization axis of lead zirconate titanate contained in the piezoelectric film 16 to be substantially perpendicular to the upper surface 11a, and it is thus possible to improve the piezoelectric properties of the piezoelectric film 16.

It is assumed that the piezoelectric film 16 includes a lead zirconate titanate film 16a which has a tetragonal crystal structure and is (001)-oriented (see FIG. 10). In such a case, the lead zirconate titanate film 16a is oriented so that the <100> direction of the lead zirconate titanate film 16a, which is a direction along the upper surface 11a of the substrate 11 composed of a silicon substrate, is parallel to the <100> direction of the substrate 11 itself, which is a direction along the upper surface 11a.

For example, when forming the piezoelectric film 16 by a sputtering method, each of a plurality of crystal grains 16g (see FIG. 8) contained in the piezoelectric film 16 can be polarized by plasma. Consequently, each of the plurality of crystal grains 16g contained in the piezoelectric film 16 formed has spontaneous polarization. In addition, the spontaneous polarization of each of the plurality of crystal grains 16g includes a polarization component P1 (see FIG. 8) parallel to the thickness direction of the piezoelectric film 16. Moreover, the polarization components P1 included in the spontaneous polarization of each of the plurality of crystal grains 16g face the same direction as each other. As a result, the piezoelectric film 16 formed has spontaneous polarization as a whole from the time point at which the piezoelectric film 16 has not yet subjected to a polarization treatment.

In other words, in step S5, the piezoelectric film 16 can be polarized by plasma when being formed by a sputtering method. As a result, in a case in which the film structure 10 according to the present embodiment is used as a piezoelectric element, the piezoelectric film 16 is not required to be subjected to a polarization treatment before being used as described with reference to FIG. 6.

In addition, in step S5, the piezoelectric film 16 has a compressive stress, for example, as the sputtered particles and argon (Ar) gas are injected into the piezoelectric film 16 and the piezoelectric film 16 expands when forming the piezoelectric film 16 by a sputtering method.

Next, the piezoelectric film 17 is formed (step S6) as illustrated in FIG. 1. In this step S6, the piezoelectric film 17 containing a composite oxide that is represented by the general formula (Chem. 5) and composed of lead zirconate titanate (PZT) is formed on the piezoelectric film 16 by, for example, a coating method such as a sol-gel method. Hereinafter, a method for forming the piezoelectric film 17 by a sol-gel method will be described.

In step S6, a film containing a precursor of PZT is first formed by applying a solution containing lead, zirconium, and titanium onto the piezoelectric film 16. Incidentally, the step of applying a solution containing lead, zirconium, and titanium may be repeated plural times, and a film including a plurality of films laminated one over another is thus formed.

In step S6, next, the piezoelectric film 17 containing PZT is formed by subjecting the film to a heat treatment to oxidize and crystallize the precursor. Here, in the formula (Chem. 5), y satisfies 0.32≤y≤0.52.

Among these, in a case in which y satisfies 0.32≤y≤0.48, PZT contained in the piezoelectric film 17 originally has a composition to have a rhombohedral crystal structure but is likely to have a tetragonal crystal structure and to be (001)-oriented mainly by the binding force from the substrate 11, and the like. Moreover, the piezoelectric film 17 containing PZT is epitaxially grown on the piezoelectric film 16. Incidentally, in a case in which y satisfies 0.48<y≤0.52, PZT contained in the piezoelectric film 17 originally has a composition to have a tetragonal crystal structure and thus has a tetragonal crystal structure and is (001)-oriented. Moreover, the piezoelectric film 17 containing PZT is epitaxially grown on the piezoelectric film 16. This makes it possible to orient the polarization axis of lead zirconate titanate contained in the piezoelectric film 17 to be substantially perpendicular to the upper surface 11$a$, and it is thus possible to improve the piezoelectric properties of the piezoelectric film 17.

It is assumed that the piezoelectric film 17 includes a lead zirconate titanate film 17$a$ which has a tetragonal crystal structure and is (001)-oriented (see FIG. 10). In such a case, the lead zirconate titanate film 17$a$ is oriented so that the <100> direction of the lead zirconate titanate film 17$a$, which is a direction along the upper surface 11$a$ of the substrate 11 composed of a silicon substrate, is parallel to the <100> direction of the substrate 11 itself, which is a direction along the upper surface 11$a$.

In a case in which PZT having a tetragonal crystal structure is (001)-oriented, the polarization direction parallel to the [001] direction and the electric field direction parallel to the thickness direction of the piezoelectric film 15 are parallel to each other, and thus the piezoelectric properties are improved. In other words, in PZT having a tetragonal crystal structure, piezoelectric constants $d_{33}$ and $d_{31}$ having large absolute values are attained in a case in which an electric field is applied along the [001] direction. Hence, the piezoelectric constant of the piezoelectric film 15 can be further increased. Incidentally, in the description of the present application, the sign of the piezoelectric constant $d_{31}$ is originally negative, but the sign is omitted and the piezoelectric constant $d_{31}$ is expressed as an absolute value in some cases.

In step S6, the piezoelectric film 17 has a tensile stress, for example, as the solvent in the solution evaporates at the time of heat treatment or the film shrinks when the precursor is oxidized and crystallized.

In this manner, the piezoelectric film 15 including the piezoelectric film 16 and the piezoelectric film 17 is formed, and the film structure 10 illustrated in FIG. 1 is formed. In other words, step S5 and step S6 are included in the step of forming the piezoelectric film 15 containing lead zirconate titanate that is (001)-oriented in tetragonal crystal display or (100)-oriented in pseudo-cubic crystal display and epitaxially grown on the conductive film 13 with the film 14 interposed therebetween.

As described with reference to FIG. 11 above, when PZT contained in the piezoelectric film 15 is (001)-oriented in tetragonal crystal display, that is, c-axis oriented, the lattice constant ratio of the lattice constant c in the c-axis direction of tetragonal PZT to the lattice constant a in the a-axis direction of tetragonal PZT is suitably 1.010 to 1.016.

The lattice constant ratio (c/a ratio) of the lattice constant c in the c-axis direction of ordinary tetragonal PZT to the lattice constant a in the a-axis direction of ordinary tetragonal PZT is less than 1.010. On the other hand, the c/a ratio of tetragonal PZT in the piezoelectric film 15 included in the film structure of the present embodiment is 1.010 or more. In addition, the piezoelectric properties of tetragonal PZT depend on the c/a ratio of tetragonal PZT. Hence, according to the piezoelectric film 15 included in the film structure of the present embodiment, it is possible to realize a piezoelectric film exhibiting piezoelectric properties superior to those of ordinary PZT.

Incidentally, after the piezoelectric film 17 has been formed, a conductive film 18 (see FIG. 2) as an upper electrode may be formed on the piezoelectric film 17 (step S7).

In addition, a film containing lead zirconate titanate may be formed between the film 14 and the piezoelectric film 15. The film may contain a composite oxide that is represented by the general formula (Chem. 6) and (100)-oriented in pseudo-cubic crystal display.

<Modification of Embodiment>

In the embodiment, the piezoelectric film 15 including the piezoelectric film 16 and the piezoelectric film 17 is formed as illustrated in FIG. 1. However, the piezoelectric film 15 may include only the piezoelectric film 16. Such an example will be described as a modification of the embodiment.

Figure 16:
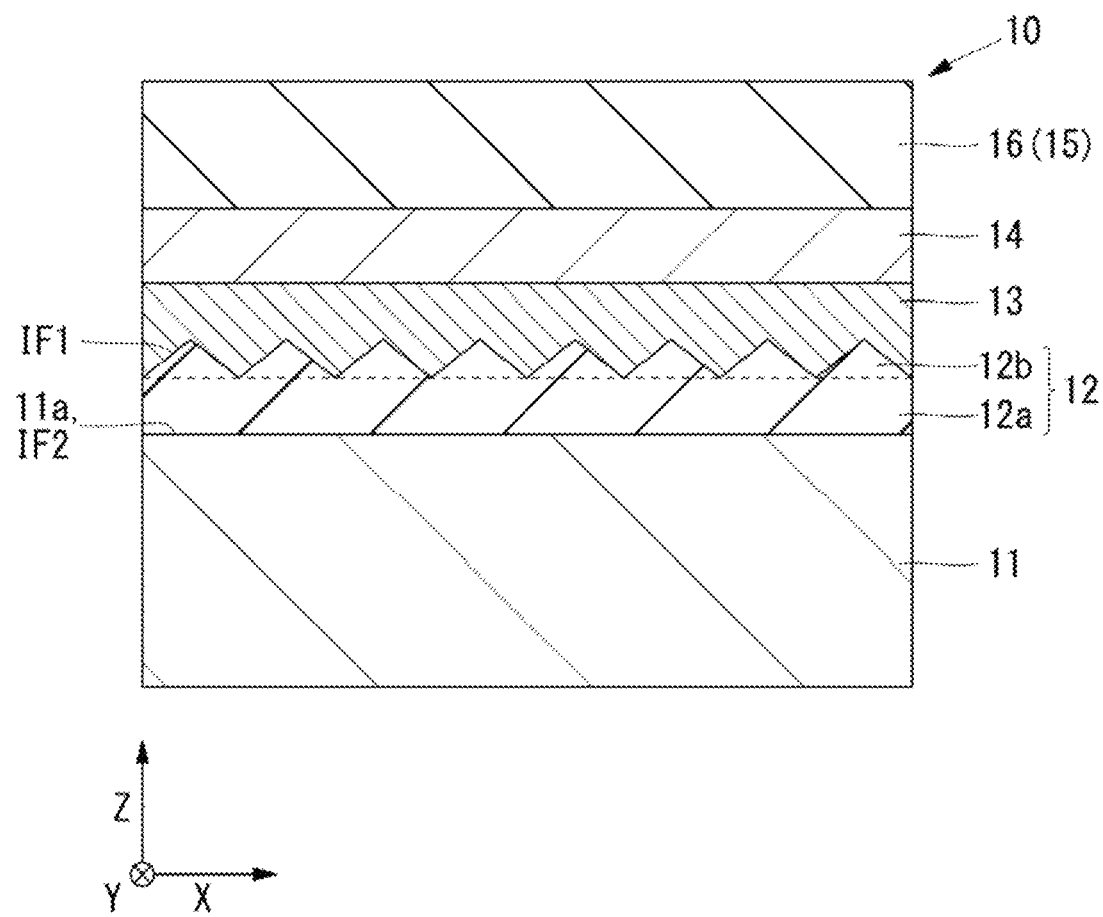
FIG. 16 is a cross-sectional view of a film structure according to a modification of an embodiment.

FIG. 16 is a cross-sectional view of a film structure according to a modification of the embodiment.

As illustrated in FIG. 16, a film structure 10 according to the present modification includes a substrate 11, an alignment film 12, a conductive film 13, a film 14, and a piezoelectric film 15. The alignment film 12 is formed on the substrate 11. The conductive film 13 is formed on the alignment film 12. The film 14 is formed on the conductive film 13. The piezoelectric film 15 is formed on the film 14. The piezoelectric film 15 includes a piezoelectric film 16.

In other words, the film structure 10 according to the present modification is the same as the film structure 10 according to the embodiment except that the piezoelectric film 15 does not include the piezoelectric film 17 (see FIG. 1) but includes only the piezoelectric film 16.

In a case in which the piezoelectric film 15 includes the piezoelectric film 16 having a compressive stress but does not include the piezoelectric film 17 having a tensile stress (see FIG. 1), the amount of warpage of the film structure 10 increases as compared with the case in which the piezoelectric film 15 includes both the piezoelectric film 16 having a compressive stress and the piezoelectric film 17 having a tensile stress (see FIG. 1). However, the amount of warpage of the film structure 10 can be decreased, for example, in a case in which the thickness of the piezoelectric film 15 is thin. Hence, it is possible to improve the shape accuracy, for example, in a case in which the film structure 10 is processed by a photolithography technology and to improve the properties of the piezoelectric element formed by processing the film structure 10 even in a case in which the piezoelectric film 15 includes only the piezoelectric film 16.

Incidentally, the film structure 10 according to the present modification may also have a conductive film 18 (see FIG. 2) similarly to the film structure 10 according to the embodiment.

EXAMPLES

Hereinafter, the present embodiment will be described in more detail based on Examples. It should be noted that the present invention is not limited by the following Examples.

(Examples and Comparative Examples)

Hereinafter, the film structure 10 described in the embodiment with reference to FIG. 1 was formed as a film structure of Example. In the film structure of Example, the alignment film 12 has the protrusion portion 12b. Meanwhile, in the film structure of Comparative Example, the alignment film 12 does not have the protrusion portion 12b.

Hereinafter, a method for forming the film structure of Example will be described. First, as illustrated in FIG. 12, a 6-inch wafer which was composed of a silicon single crystal and had an upper surface 11a as a main surface composed of a (100) plane was prepared as the substrate 11.

Next, as illustrated in FIG. 13, a zirconium oxide ($ZrO_2$) film was formed as the alignment film 12 on the substrate 11 by an electron beam evaporation method. The conditions at this time are presented below.

Apparatus: Electron beam evaporation apparatus
Pressure: $7.00 \times 10^{-3}$ Pa
Evaporation source: $Zr+O_2$
Acceleration voltage/emission current: 7.5 kV/1.80 mA
Thickness: 24 nm
Substrate temperature: 500° C.

Next, as illustrated in FIG. 4, a platinum (Pt) film was formed as the conductive film 13 on the alignment film 12 by a sputtering method. The conditions at this time are presented below.

Apparatus: DC sputtering apparatus
Pressure: $1.20 \times 10^{-1}$ Pa
Evaporation source: Pt
Power: 100 W
Thickness: 150 nm
Substrate temperature: 450° C. to 600° C.

Next, as illustrated in FIG. 14, an SRO film was formed as the film 14 on the conductive film 13 by a sputtering method. The conditions at this time are presented below.

Apparatus: RF magnetron sputtering apparatus
Power: 300 W
Gas: Ar
Pressure: 1.8 Pa
Substrate temperature: 600° C.
Thickness: 20 nm Next, as illustrated in FIG. 15, a $Pb(Zr_{0.58}Ti_{0.42})O_3$ film (PZT film) having a thickness of 0.91 μm was formed as the piezoelectric film 16 on the film 14 by a sputtering method. The conditions at this time are presented below.

Apparatus: RF magnetron sputtering apparatus
Power: 1750 W
Gas: $Ar/O_2$
Pressure: 1 Pa
Substrate temperature: 380° C.

In the piezoelectric film 16 formed, the film thicknesses at the respective positions which are 0 mm, 5 mm, 15 mm, 25 mm, 35 mm, 45 mm, 55 mm, 65 mm, 75 mm, 85 mm, and 95 mm distant from the center in the radial direction were 0.91 μm, 0.91 μm, 0.91 μm, 0.92 μm, 0.92 μm, 0.92 μm, 0.91 μm, 0.91 μm, 0.91 μm, 0.90 μm, and 0.89 μm, respectively. Hence, the piezoelectric film 16 having a uniform thickness over the entire surface of the substrate 11 was able to be formed.

Next, as illustrated in FIG. 1, a $Pb(Zr_{0.58}Ti_{0.42})O_3$ film (PZT film) was formed as the piezoelectric film 17 on the piezoelectric film 16 by a coating method. The conditions at this time are presented below.

A raw material solution was prepared by mixing organometallic compounds of Pb, Zr, and Ti together so as to have a composition ratio of $Pb:Zr:Ti=100+\delta:58:42$ and dissolving the mixture in a mixed solvent of ethanol and 2-n-butoxyethanol so as to have a concentration as $Pb(Zr_{0.58}Ti_{0.42})O_3$ of 0.35 mol/l. δ was set to δ=20. Thereafter, 20 g of polypyrrolidone having a K value of 27 to 33 was further dissolved in the raw material solution.

Next, 3 ml of the raw material solution was taken from the raw material solution prepared and dropped on the substrate 11 composed of a 6-inch wafer, and the substrate 11 was rotated at 3000 rpm for 10 seconds to apply the raw material solution onto the substrate 11, whereby a film containing a precursor was formed. Thereafter, the substrate 11 was placed on a hot plate at a temperature of 200° C. for 30 seconds and further the substrate 11 was placed on a hot plate at a temperature of 450° C. for 30 seconds to evaporate the solvent and to dry the film. Thereafter, the precursor was oxidized and crystallized through a heat treatment at 600° C. to 700° C. for 60 seconds in an oxygen ($O_2$) atmosphere at 0.2 MPa to form the piezoelectric film 17 having a thickness of 30 nm.

For each of Example and Comparative Example, the θ-2θ spectrum of the film structure in which up to the PZT film as the piezoelectric film 17 was formed was measured by an X-ray diffraction (XRD) method. In other words, each of Example and Comparative Example was subjected to X-ray diffraction measurement by a θ-2θ method.

Figure 17:
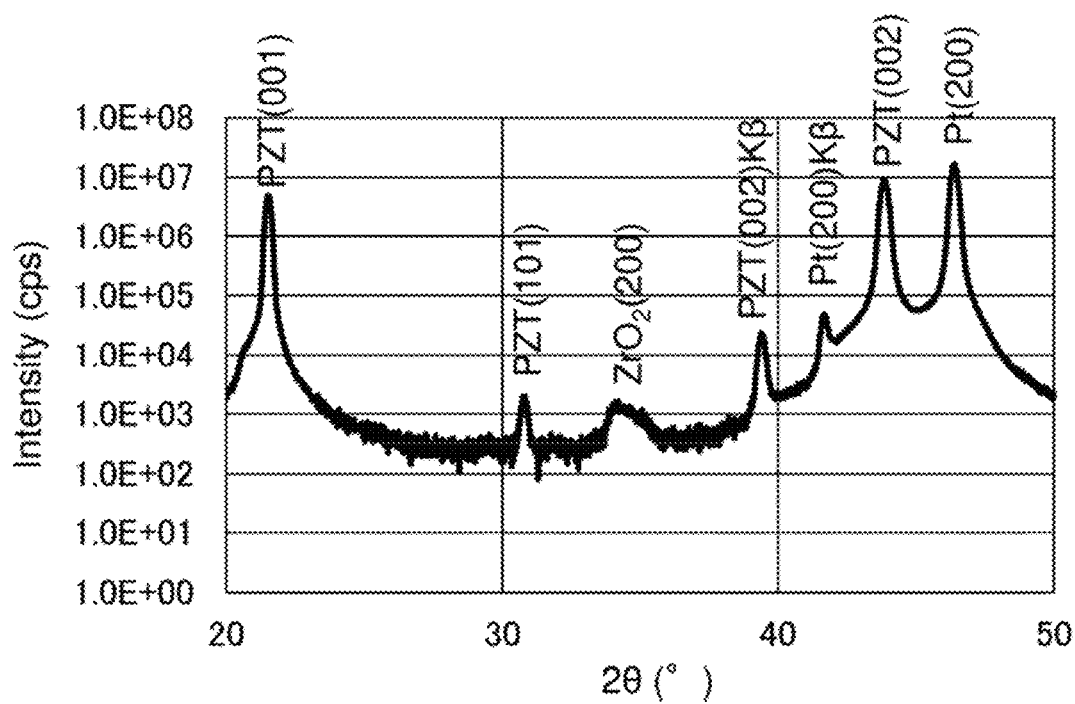
FIG. 17 is a graph illustrating an example of a θ-2θ spectrum of a film structure of Example by an XRD method.
Figure 18:
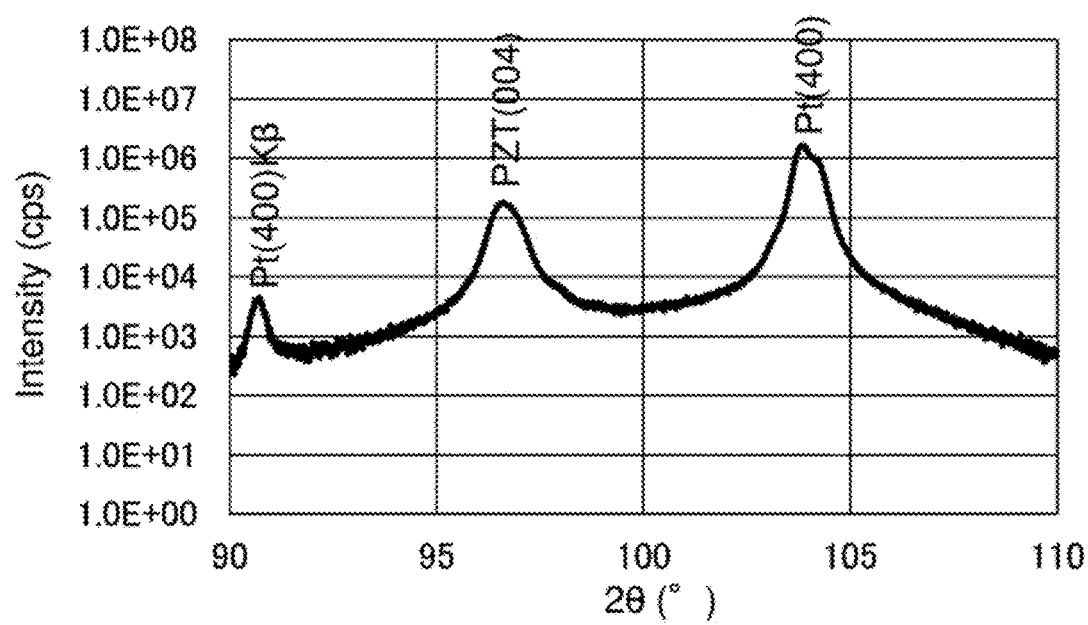
FIG. 18 is a graph illustrating an example of a θ-2θ spectrum of a film structure of Example by an XRD method.
Figure 19:
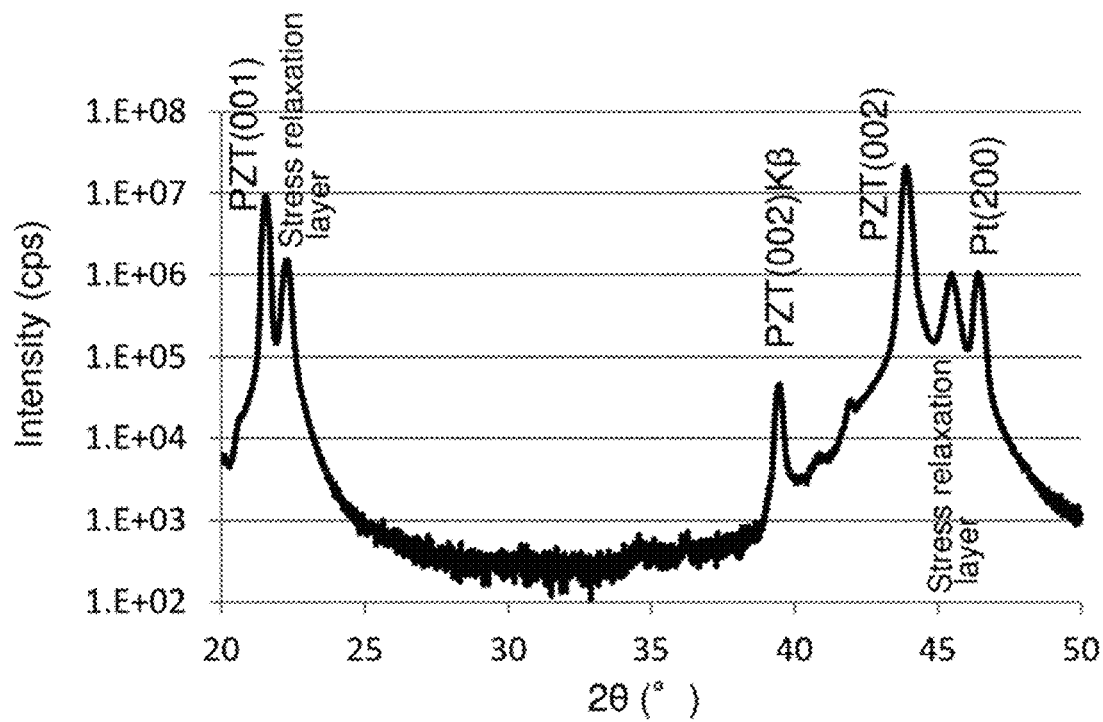
FIG. 19 is a graph illustrating an example of a θ-2θ spectrum of a film structure of Comparative Example by an XRD method.
Figure 20:
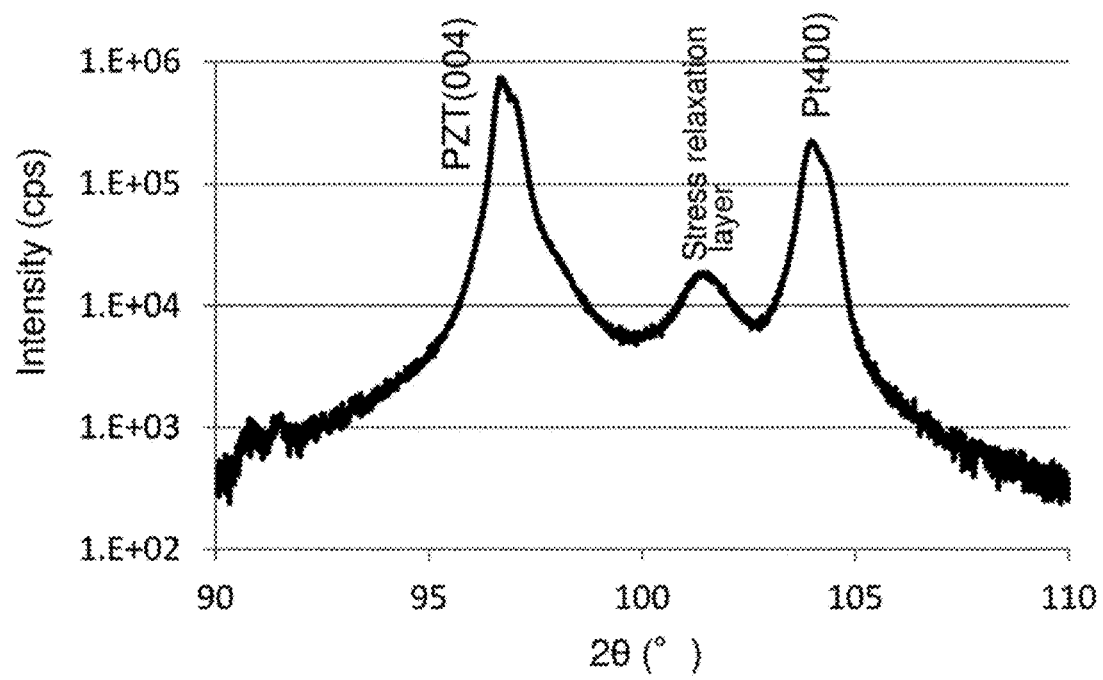
FIG. 20 is a graph illustrating an example of a θ-2θ spectrum of a film structure of Comparative Example by an XRD method.

FIGS. 17 to 20 are graphs each illustrating an example of the θ-2θ spectrum of the film structure in which up to the PZT film was formed measured by the XRD method. The horizontal axis of each graph in FIGS. 17 to 20 indicates the angle 2θ, and the vertical axis of each graph in FIGS. 17 to 20 indicates the intensity of X-rays. FIGS. 17 and 18 illustrate the results for Examples, and FIGS. 19 and 20 illustrate the results for Comparative Examples. FIGS. 17 and 19 illustrate the range of $20° \leq 2\theta \leq 50°$, and FIGS. 18 and 20 illustrate the range of $90° \leq 2\theta \leq 110°$.

In the examples (Examples) illustrated in FIGS. 17 and 18, peaks corresponding to the (200) and (400) planes of Pt having a cubic crystal structure and peaks corresponding to the (001), (002), and (004) planes of PZT in tetragonal crystal display were observed in the θ-2θ spectrum. Hence, in the examples (Examples) illustrated in FIGS. 17 and 18, it has been found that the conductive film 13 contains Pt which has a cubic crystal structure and is (100)-oriented and the piezoelectric film 15 contains PZT (001)-oriented in tetragonal crystal display.

In addition, in the example (Example) illustrated in FIG. 18, $2\theta_{004}=96.5°$ where $2\theta_{004}$ denoted the diffraction angle of the diffraction peak of the (004) plane in tetragonal crystal display of PZT. Hence, in the examples (Examples) illustrated in FIGS. 17 and 18, it has been found that $2\theta_{004}$ satisfies $2\theta_{004}$ 96.5° and the equation (Math. 1).

In the examples (Comparative Examples) illustrated in FIGS. 19 and 20 also, peaks corresponding to the (200) and (400) planes of Pt having a cubic crystal structure and peaks corresponding to the (001), (002), and (004) planes of PZT in tetragonal crystal display were observed in the θ-2θ spectrum similarly to the examples (Examples) illustrated in FIGS. 17 and 18. Hence, in the examples (Comparative Examples) illustrated in FIGS. 19 and 20 also, it has been found that the conductive film 13 contains Pt which has a cubic crystal structure and is (100)-oriented and the piezoelectric film 15 contains PZT (001)-oriented in tetragonal crystal display similarly to the examples (Examples) illustrated in FIGS. 17 and 18.

However, in the example (Comparative Example) illustrated in FIG. 20, $2\theta_{004}$=96.7° where $2\theta_{004}$ denotes the diffraction angle of the diffraction peak of the (004) plane in tetragonal crystal display of PZT unlike the example (Example) illustrated in FIG. 18. Hence, in the examples (Comparative Examples) illustrated in FIGS. 19 and 20, it has been found that $2\theta_{004}$ does not satisfy $2\theta_{004} \leq 96.5°$ and the equation (Math. 1).

Figure 21:
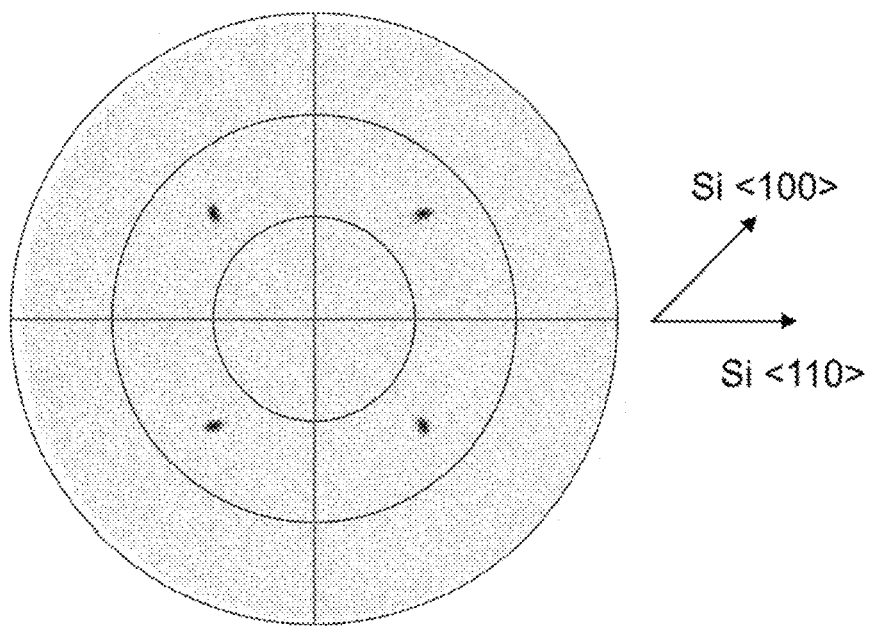
FIG. 21 is a graph illustrating an example of a pole figure of a film structure of Example by an XRD method.
Figure 22:
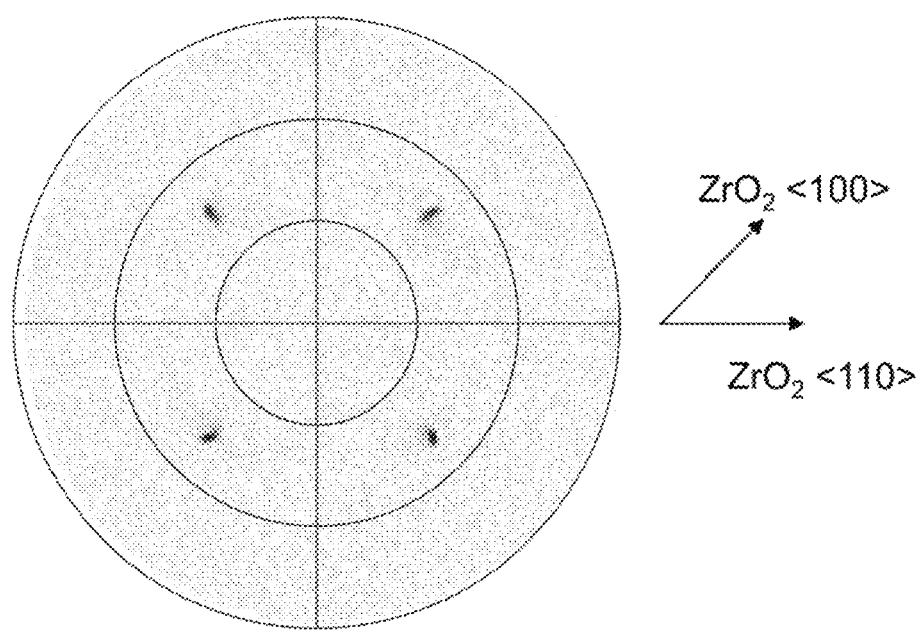
FIG. 22 is a graph illustrating an example of a pole figure of a film structure of Example by an XRD method.
Figure 23:
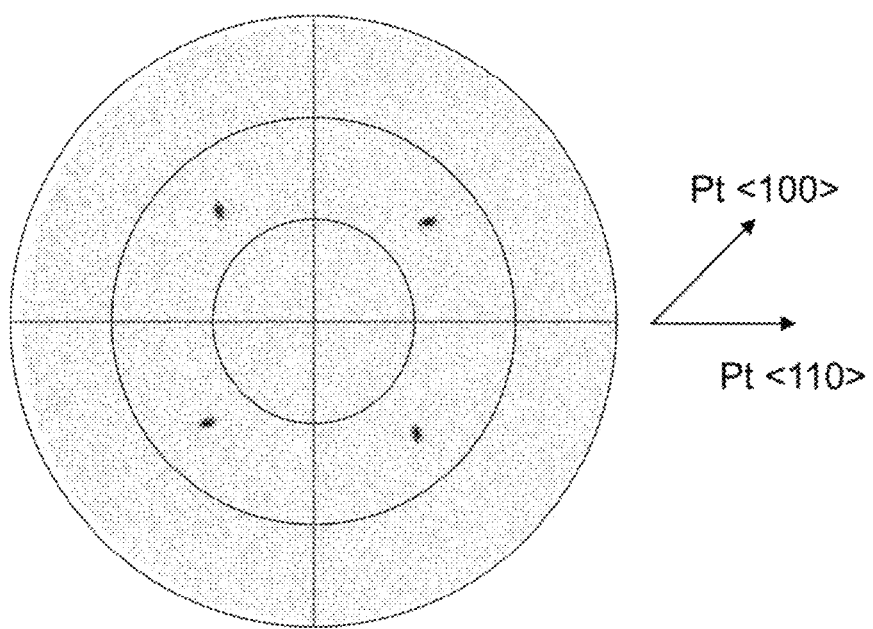
FIG. 23 is a graph illustrating an example of a pole figure of a film structure of Example by an XRD method.
Figure 24:
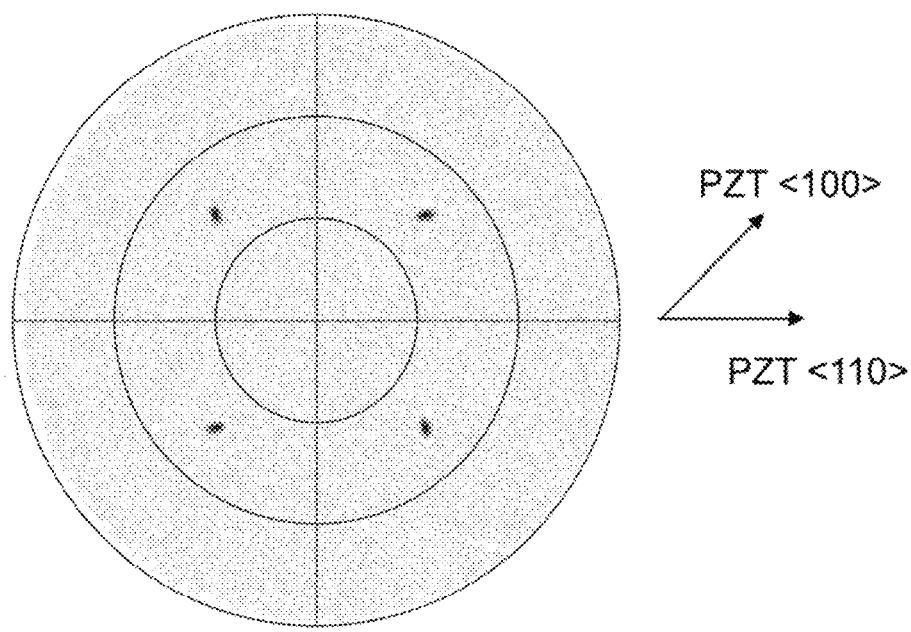
FIG. 24 is a graph illustrating an example of a pole figure of a film structure of Example by an XRD method.

For Examples, the pole figure was measured by the XRD method and the relation of the in-plane orientation of the film of each layer was examined. FIGS. 21 to 24 are graphs each illustrating an example of the pole figure of the film structure of Example by the XRD method. FIG. 21 is a pole figure of the Si (220) plane, FIG. 22 is a pole figure of the $ZrO_2$ (220) plane, FIG. 23 is a pole figure of the Pt (220) plane, and FIG. 24 is a pole figure of the PZT (202) plane.

It is assumed that the alignment film 12 includes a zirconium oxide film 12f which has a cubic crystal structure and is (100)-oriented (see FIG. 10) as described above. In such a case, it has been demonstrated that the zirconium oxide film 12f is oriented so that the <100> direction of the zirconium oxide film 12f, which is a direction along the upper surface 11a as the main surface of the substrate 11 composed of a silicon substrate, is parallel to the <100> direction of the substrate 11 itself, which is a direction along the upper surface 11a, as illustrated in FIGS. 21 and 22. In other words, it has been demonstrated that the zirconium oxide film 12f is oriented so that the <110> direction of the zirconium oxide film 12f, which is a direction along the upper surface 11a as the main surface of the substrate 11 composed of a silicon substrate, is parallel to the <110> direction of the substrate 11 itself, which is a direction along the upper surface 11a.

In addition, it is assumed that the conductive film 13 includes a platinum film 13a which has a cubic crystal structure and is (100)-oriented (see FIG. 10). In such a case, it has been demonstrated that the platinum film 13a is oriented so that the <100> direction of the platinum film 13a, which is a direction along the upper surface 11a of the substrate 11 composed of a silicon substrate, is parallel to the <100> direction of the substrate 11 itself, which is a direction along the upper surface 11a, as illustrated in FIGS. 21 and 23. In other words, it has been demonstrated that the platinum film 13a is oriented so that the <110> direction of the platinum film 13a, which is a direction along the upper surface 11a of the substrate 11 composed of a silicon substrate, is parallel to the <110> direction of the substrate 11 itself, which is a direction along the upper surface 11a.

In addition, it is assumed that the piezoelectric film 15 includes a lead zirconate titanate film 15a which has a tetragonal crystal structure and is (001)-oriented (see FIG. 10). In such a case, it has been demonstrated that the lead zirconate titanate film 15a is oriented so that the <100> direction of the lead zirconate titanate film 15a, which is a direction along the upper surface 11a of the substrate 11 composed of a silicon substrate, is parallel to the <100> direction of the substrate 11 itself, which is a direction along the upper surface 11a, as illustrated in FIGS. 21 and 24. In other words, it has been demonstrated that the lead zirconate titanate film 15a is oriented so that the <110> direction of the lead zirconate titanate film 15a, which is a direction along the upper surface 11a of the substrate 11 composed of a silicon substrate, is parallel to the <110> direction of the substrate 11 itself, which is a direction along the upper surface 11a.

Figure 25:
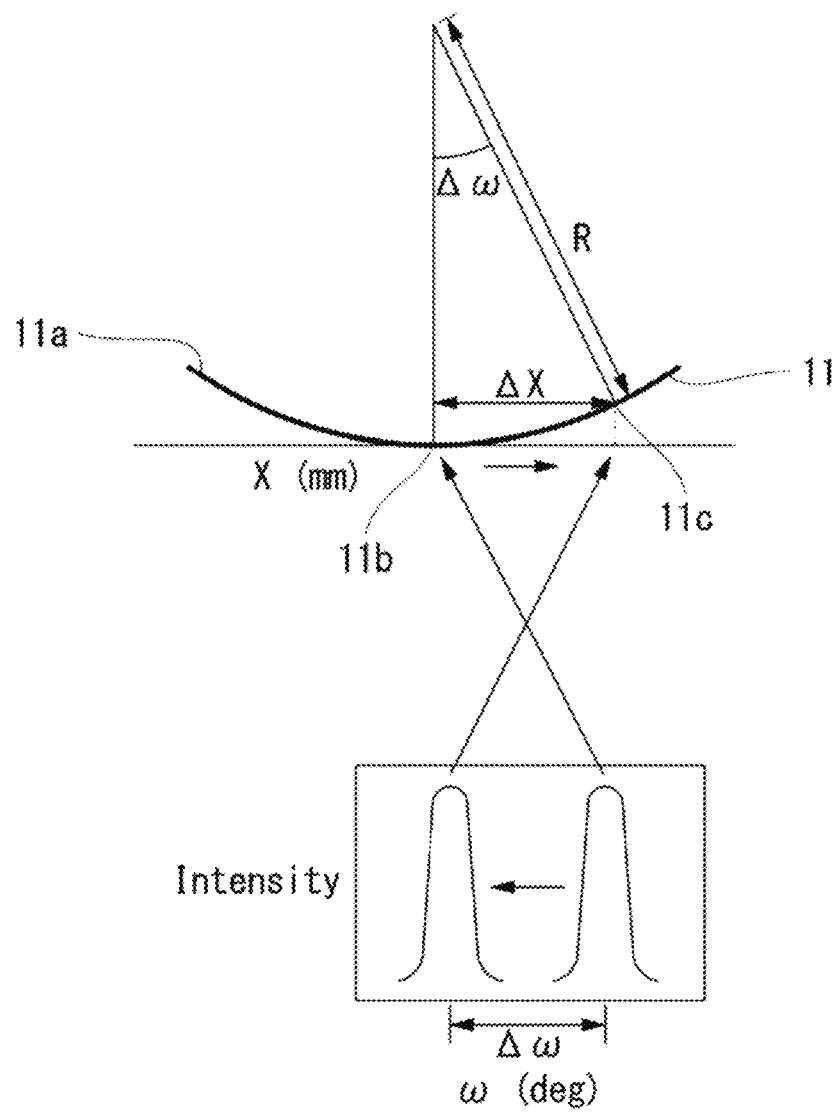
FIG. 25 is a diagram for explaining a method for measuring an amount of warpage of a substrate by an XRD method.
Figure 26:
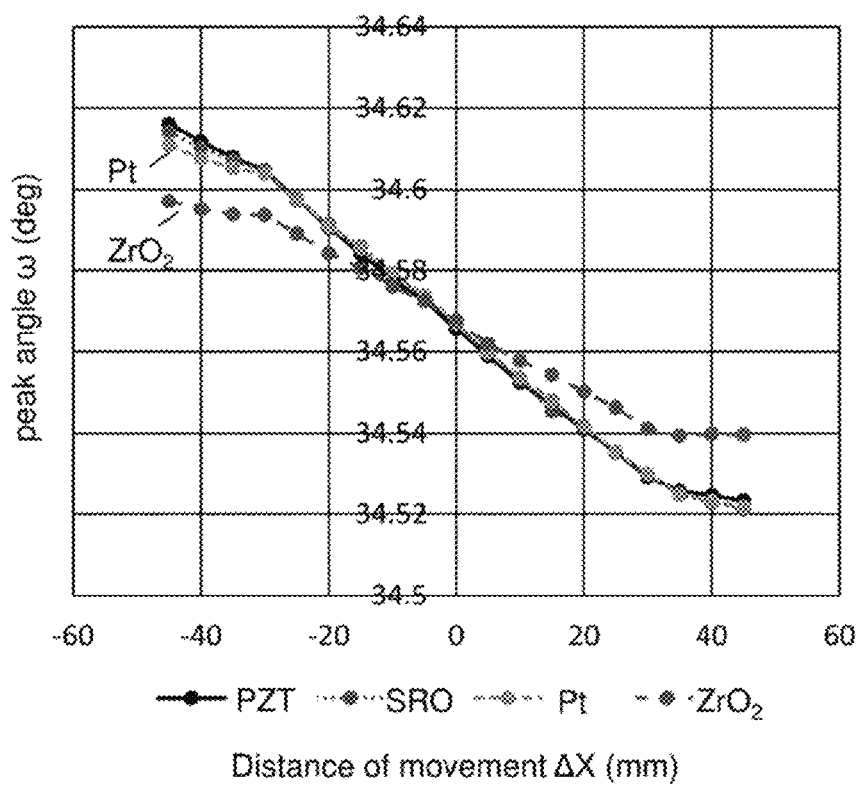
FIG. 26 is a graph illustrating a result for an amount of warpage of a substrate measured by an XRD method.

For Examples, the amount of warpage of the substrate 11 was measured when forming the alignment film 12, the conductive film 13, the film 14, and the piezoelectric film 15 on the substrate 11 in order to measure the stress of each layer. FIG. 25 is a diagram for explaining the method for measuring the amount of warpage of the substrate by an XRD method. FIG. 26 is a graph illustrating the result for the amount of warpage of the substrate measured by an XRD method.

As illustrated in FIG. 25, with regard to the amount of warpage of the substrate 11, the radius of curvature R indicating the degree of the amount of warpage of the substrate 11 can be calculated by a calculation formula of $R=\Delta X/\sin(\Delta\omega)$ where the distance $\Delta X$ denotes the distance along the upper surface 11a of the substrate 11 from a center 11b of the upper surface 11a of the substrate 11 to a measurement portion 11c and the angle A denotes the difference (shift amount) of the peak angle of the rocking curve (ω scan) by the XRD method with respect to the reference angle.

Moreover, a rocking curve (ω scan) was measured at the respective positions on a certain straight line which passed through the center 11b of the upper surface 11a of the substrate 11 and was along the upper surface 11a of the substrate 11 by the XRD method, and the dependency of the peak angle ω of the rocking curve on the distance from the center 11b of the upper surface 11a of the substrate 11 was determined. The results are illustrated in FIG. 26. Incidentally, in FIG. 26, for example, the measurement result at the time point at which the $ZrO_2$ film is formed is written as "$ZrO_2$".

As illustrated in FIG. 26, the substrate 11 had a compressive stress at the time point ("$ZrO_2$" in FIG. 26) at which the alignment film 12 was formed on the substrate 11. Hence, the alignment film 12 had a tensile stress at the time point at which the alignment film 12 was formed on the substrate 11. In addition, the radius of curvature R was 66.1 mm.

In addition, as illustrated in FIG. 26, the compressive stress of the substrate 11 increased at the time point ("Pt" in FIG. 26) at which the conductive film 13 was formed on the alignment film 12. In addition, the radius of curvature R was 46.7 mm. Hence, as described with reference to FIG. 6 above, it has been demonstrated that the conductive film 13 has a tensile stress TS1 and the alignment film 12 has a compressive stress CS1 or a tensile stress TS2 weaker than the tensile stress TS1 at the time point at which the conductive film 13 is formed on the alignment film 12.

Incidentally, as illustrated in FIG. 26, the compressive stress of the substrate 11 hardly changed at the time point ("SRO" and "PZT" in FIG. 26) at which the film 14 and the piezoelectric film 15 were formed on the conductive film 13 after the conductive film 13 was formed on the alignment film 12. In addition, the radii of curvature R were 45.4 mm and 44.1 mm, respectively. Hence, it has been demonstrated that the conductive film 13 has the tensile stress TS1 and the alignment film 12 has the compressive stress CS1 or the tensile stress TS2 weaker than the tensile stress TS1 at the time point at which the film 14 and the piezoelectric film 15 were formed on the conductive film 13 as well.

With regard to the crystal structure of the film structure of Example, an image of a cross section (cross-sectional TEM image) perpendicular to the upper surface 11a of the substrate 11 was taken using a transmission electron microscope (TEM). As the cross-sectional TEM images, a high angle annular dark field (HAADF) image and a bright field (BF) image were taken. Incidentally, an image of a cross section perpendicular to the <110> direction of Si of the substrate 11 was taken as a cross section perpendicular to the upper surface 11a of the substrate 11.

Figure 27:
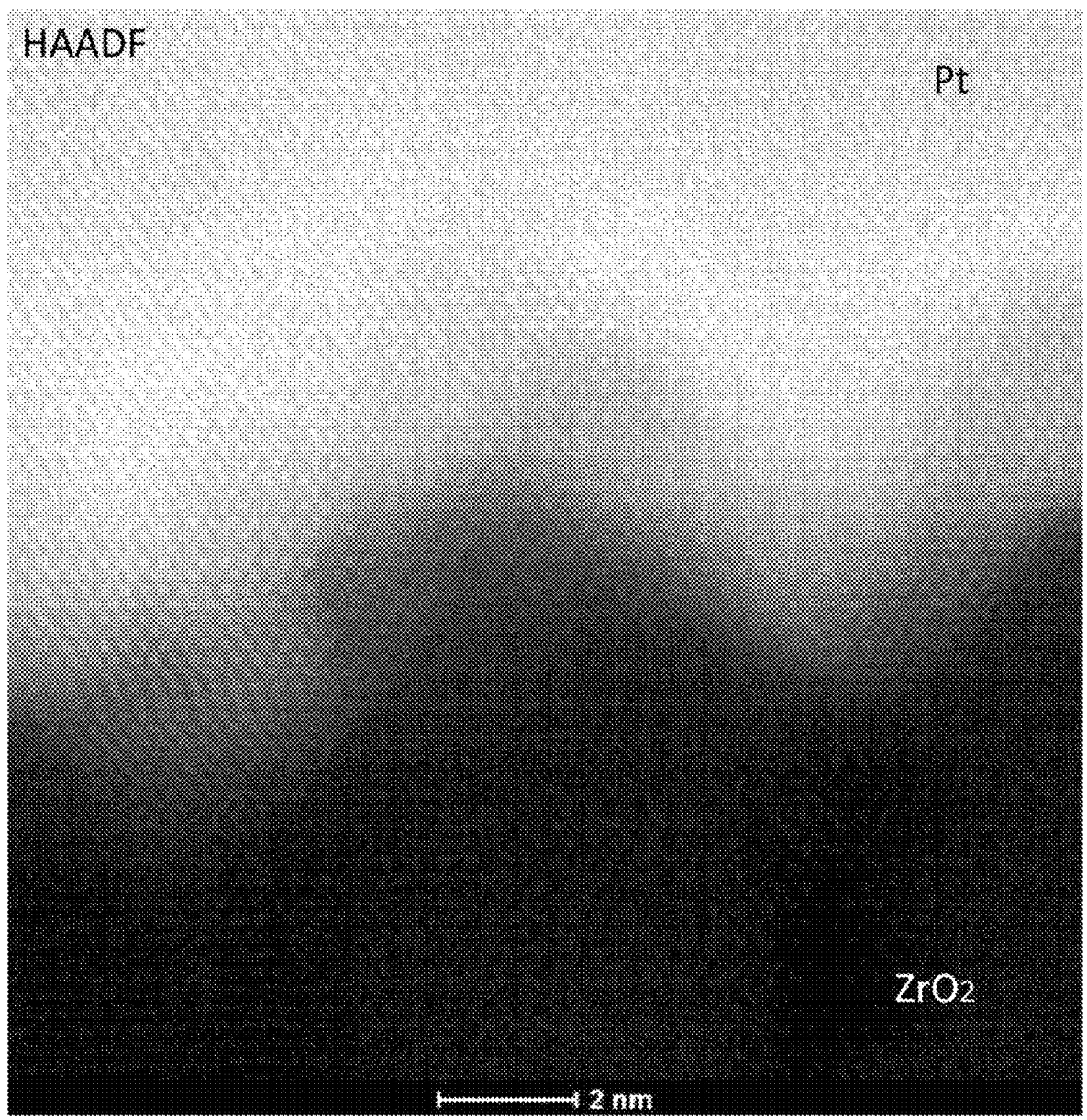
FIG. 27 is a photograph illustrating a HAADF image of a film structure of Example.
Figure 28:
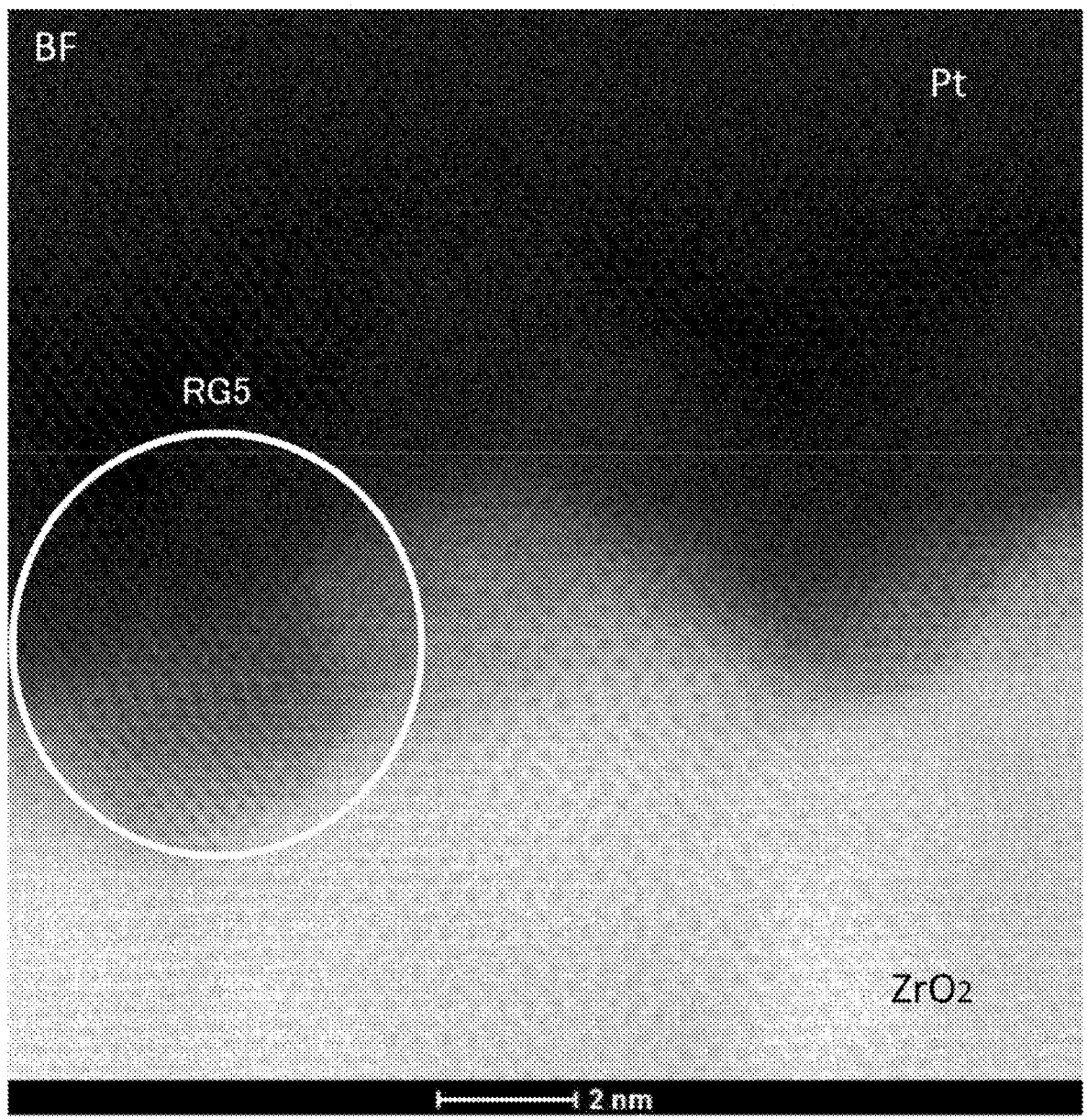
FIG. 28 is a photograph illustrating a BF image of a film structure of Example.
Figure 29:
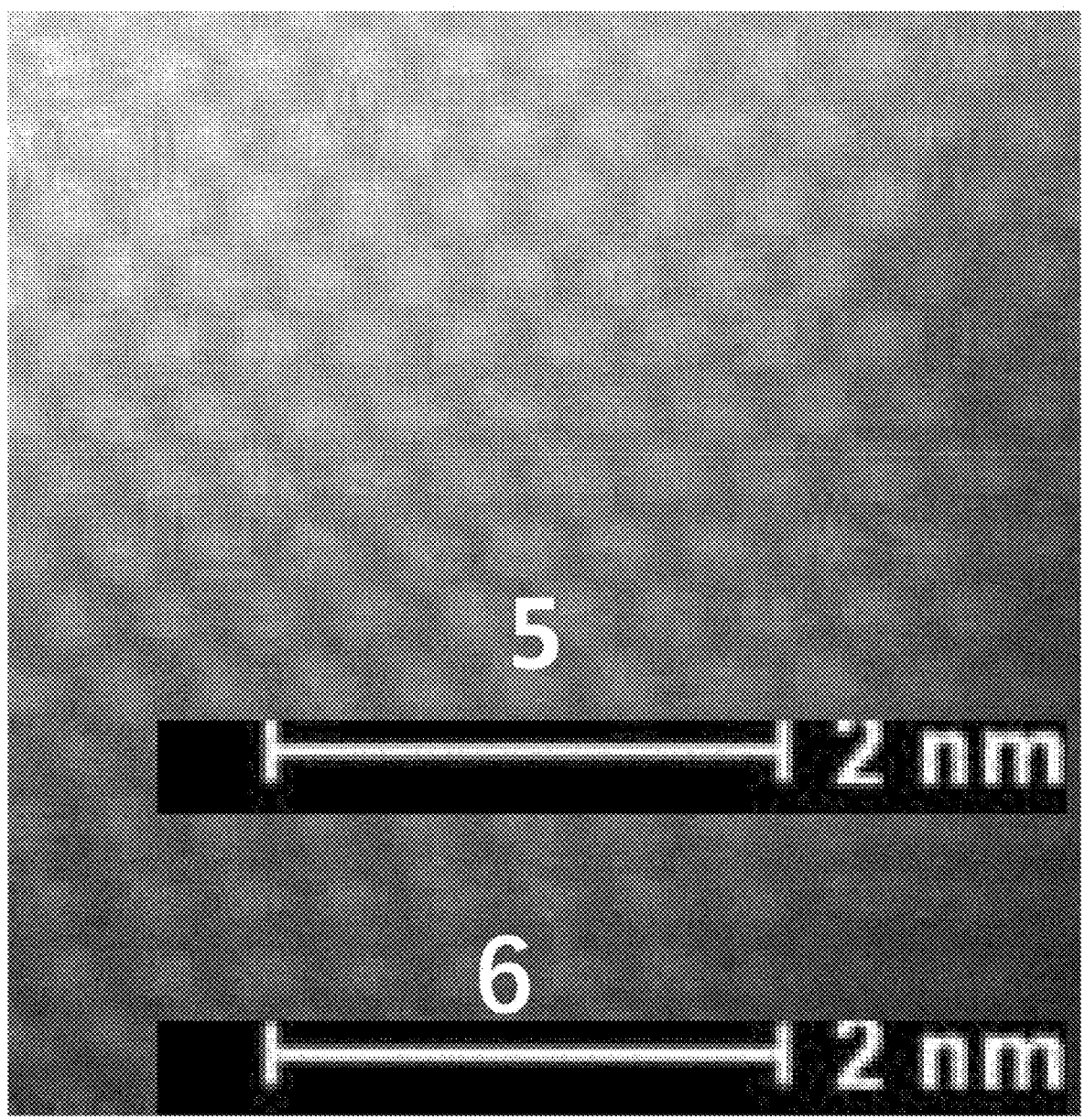
FIG. 29 is a photograph illustrating a BF image of a film structure of Example.
Figure 30:
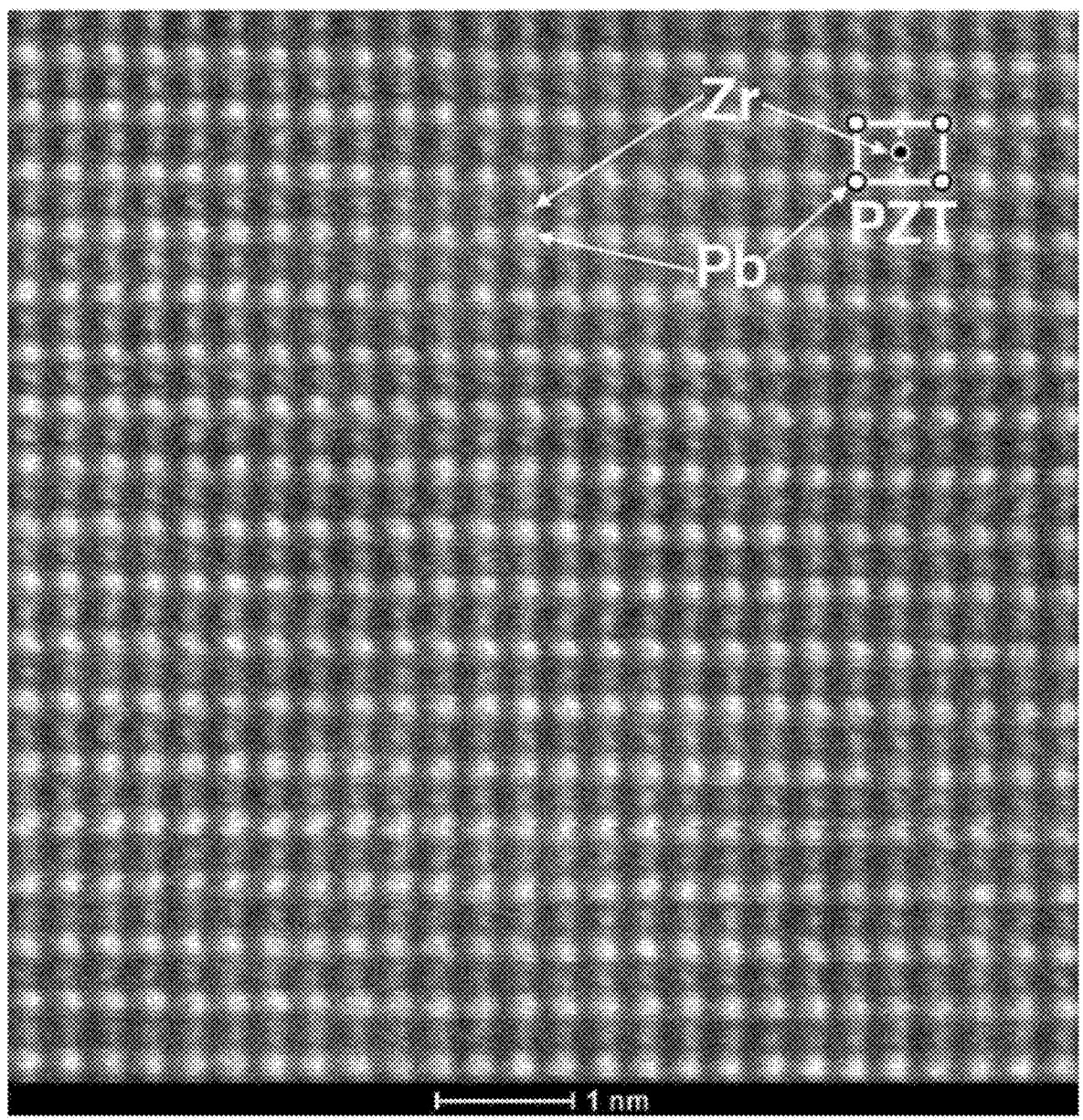
FIG. 30 is a photograph illustrating a HAADF image of a film structure of Example.

FIG. 27 is a photograph illustrating a HAADF image of the film structure of Example. FIGS. 28 and 29 are photographs illustrating BF images of the film structures of Examples. FIG. 30 is a photograph illustrating a HAADF image of the film structure of Example.

FIG. 27 illustrates a cross-sectional region near the interface IF1 (see FIG. 5) between the $ZrO_2$ film included in the alignment film 12 (see FIG. 5) and the Pt film included in the conductive film 13 (see FIG. 5). FIG. 28 illustrates the same cross-sectional region as the cross-sectional region illustrated in FIG. 27. FIG. 29 illustrates a cross-sectional region near the interface IF1 (see FIG. 5), which is a cross-sectional region slightly apart from the cross-sectional region illustrated in FIGS. 27 and 28. FIG. 30 illustrates a cross-sectional region of the PZT film included in the piezoelectric film 15.

As illustrated in FIGS. 27 and 28, the interface IF1 between the $ZrO_2$ film and the Pt film is not flat, and it has been thus demonstrated that the alignment film 12 includes the film portion 12a and the protrusion portion 12b as described with reference to FIG. 5 above. In addition, the height of the protrusion portion 12b was 6 nm in the cross-sectional region illustrated in FIGS. 27 and 28, and the average value of the height of the protrusion portion 12b was 6 nm and 3σ, which was three times the standard deviation of the height of the protrusion portion 12b, was 2 nm when cross-sectional regions other than the cross-sectional region were also taken into account. Hence, the height of the protrusion portion 12b was 4 to 8 nm.

In addition, when the region RG5 in FIG. 28 was enlarged, it was observed that about 5.5 or about 6 unit lattices of $ZrO_2$ per 2 nm were arranged along the horizontal direction, namely, the direction parallel to the upper surface 11a of the substrate 11. In addition, about 5.5 or about 6 unit lattices of $ZrO_2$ per 2 nm were arranged along the horizontal direction in the cross-sectional region near the character "6" in FIG. 29, but about 5 unit lattices of $ZrO_2$ per 2 nm were arranged along the horizontal direction in the cross-sectional region near the character "5" in FIG. 29, and the upper layer portion of the $ZrO_2$ film was more stretched and distorted in the horizontal direction as compared with the lower layer portion of the $ZrO_2$ film. By this, it has been demonstrated that the upper layer portion of the alignment film 12 has a compressive stress CS2 and the lower layer portion of the alignment film 12 has a tensile stress TS3.

In addition, as illustrated in FIG. 30, it has been confirmed that the PZT film included in the piezoelectric film 15 is a single crystal as any disorder of the crystal lattice such as dislocation is not observed. The crystal lattice illustrated in FIG. 30 indicates the crystal lattice when viewed from the <110> direction of PZT and indicates the crystal lattice of PZT in FIG. 11 when viewed from the direction of arrow AR1 in FIG. 11, namely, the crystal lattice in the plane PLU as the (110) plane of PZT.

From the cross-sectional TEM image in FIG. 30, the lattice constant a in the a-axis direction of tetragonal PZT and the lattice constant c in the c-axis direction of tetragonal PZT were determined. As a result, the lattice constant a was 0.410 nm, the lattice constant c was 0.415 nm, and the lattice constant ratio (c/a ratio) was 1.016. Meanwhile, when the lattice constant a and the lattice constant c were determined from the X-ray diffraction pattern by the θ-2θ method, the lattice constant a was 0.408 nm, the lattice constant c was 0.414 nm, and the lattice constant ratio (c/a ratio) was 1.015. Hence, the lattice constant determined from the cross-sectional TEM image substantially coincided with the lattice constant determined from the X-ray diffraction pattern by the θ-2θ method.

The lattice constant a of rhombohedral PZT in the composition (Zr/Ti=58/42) of u=0.42 in the general formula (Chem. 3) is 0.4081 nm when the lattice constant a is calculated, for example, from the powder diffraction file (PDF) of the international center for diffraction data (ICDD) according to the Vegard's law. Hence, it has been demonstrated that the lattice constant of the PZT film included in the piezoelectric film 15 included in the film structure of the present embodiment is completely different from the lattice constant a of ordinary rhombohedral PZT at Zr/Ti=58/42.

In addition, the lattice constant ratio (c/a ratio) of ordinary tetragonal PZT is less than 1.010. On the other hand, it has been demonstrated that the c/a ratio of tetragonal PZT in the piezoelectric film 15 included in the film structure of the present embodiment is 1.010 or more and can be increased to a maximum of 1.016.

Figure 31:
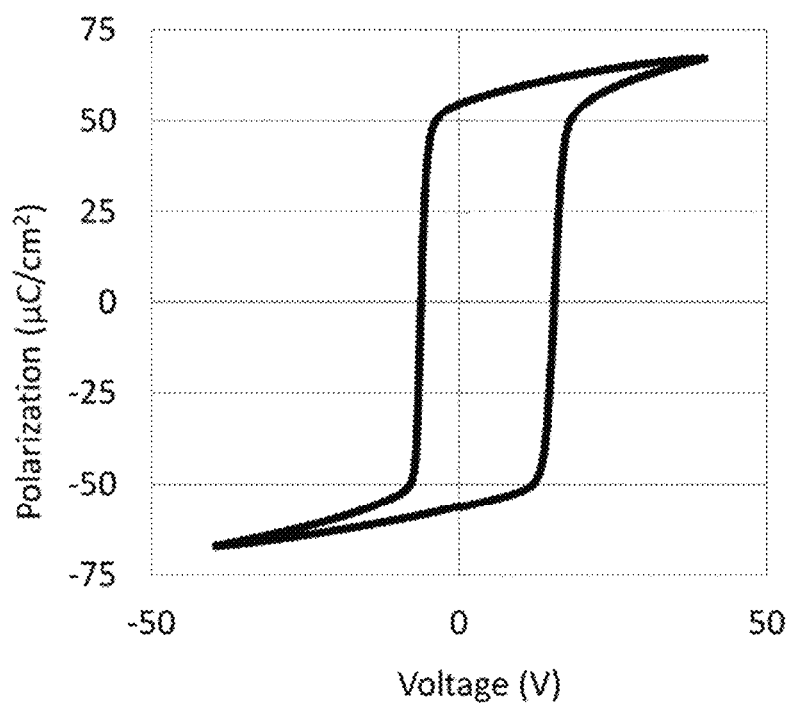
FIG. 31 is a graph illustrating voltage dependency of polarization of a film structure of Example.
Figure 32:
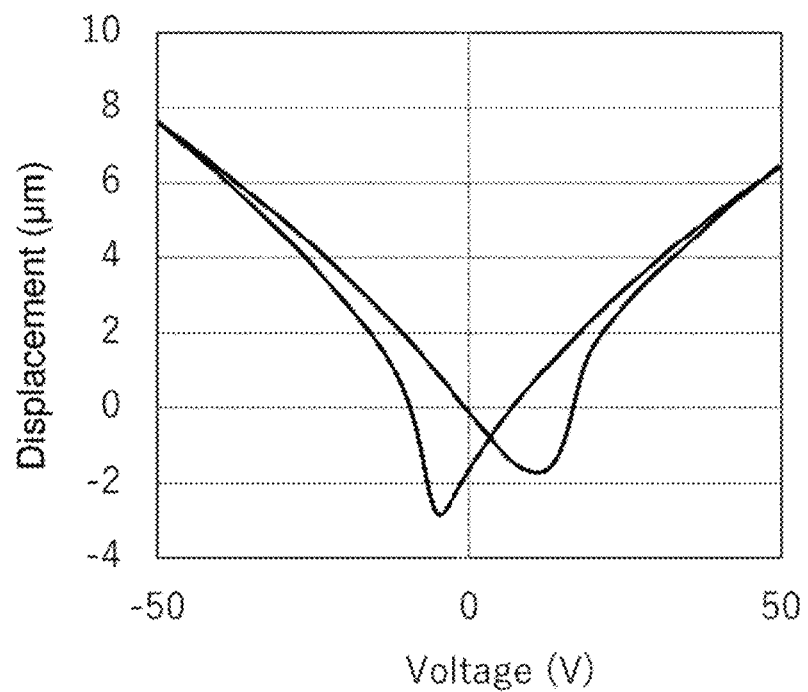
FIG. 32 is a graph illustrating voltage dependency of displacement of a film structure of Example.

In addition, with regard to the film structure of Example, the voltage dependency of polarization was measured by applying a voltage to between the conductive film 13 and the conductive film 18. FIG. 31 is a graph illustrating the voltage dependency of polarization of the film structure of Example. In addition, with regard to the film structure of Example, a cantilever was formed, and the voltage dependency of displacement of the film structure of Example was measured using the cantilever formed. FIG. 32 is a graph illustrating the voltage dependency of displacement of the film structure of Example.

According to FIG. 31, the relative dielectric constant $ε_r$ was 216 and the remanent polarization value $P_r$ was 57 $μC/cm^2$ in the film structure of Example. In addition, according to FIG. 32, the piezoelectric constant $d_{31}$ was 230 μm/V.

Here, when the voltage dependency of polarization and displacement was also measured for the film structure of Comparative Example in which the alignment film 12 did not have the protrusion portion 12b, the relative dielectric constant $ε_r$ was 580, the remanent polarization value $P_r$ was 18 $μC/cm^2$, and the piezoelectric constant $d_{31}$ was 178 μm/V. In other words, the film structure of Example exhibited extremely superior remanent polarization properties and piezoelectric properties as compared with the film structure of Comparative Example. Consequently, it has been demonstrated that the piezoelectric properties of the film structure are improved as the alignment film 12 has the protrusion portion 12b.

Figure 33:
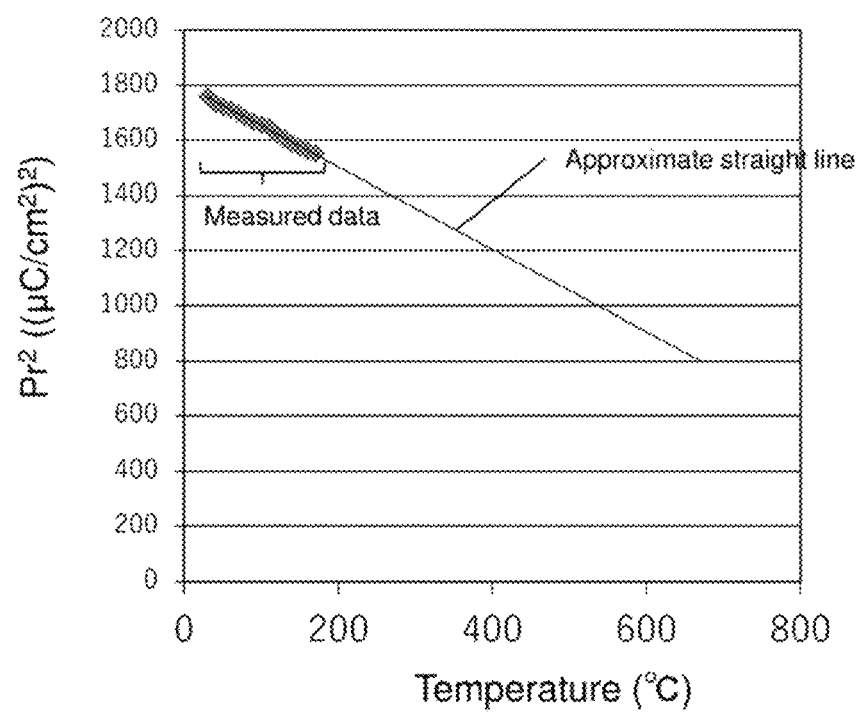
FIG. 33 is a graph illustrating temperature dependency of remanent polarization value of a film structure of Example.
Figure 34:
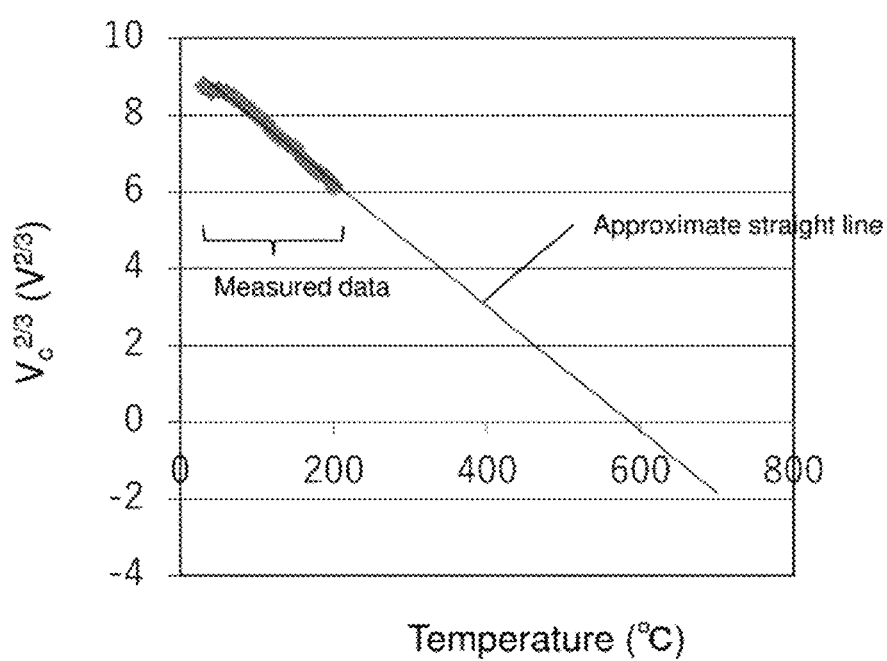
FIG. 34 is a graph illustrating temperature dependency of coercive voltage value of a film structure of Example.

Furthermore, the voltage dependency of polarization and the temperature dependency of the remanent polarization value $P_r$ and coercive voltage value $V_c$ were measured by applying a voltage to between the conductive film 13 and the conductive film 18 while changing the temperature in a range of 30° C. to 200° C. FIG. 33 is a graph illustrating the temperature dependency of remanent polarization value of the film structure of Example. FIG. 34 is a graph illustrating the temperature dependency of coercive voltage value of the film structure of Example. The vertical axis in FIG. 33 indicates the remanent polarization value $P_r$ squared and the vertical axis in FIG. 34 indicates the coercive voltage value $V_c$ to the power ⅔.

The temperature dependency of the remanent polarization value $P_r$ squared exhibited linearity as illustrated in FIG. 33, and the temperature dependency of the coercive voltage value $V_c$ to the power ⅔ exhibited linearity as illustrated in FIG. 34. The remanent polarization value in FIG. 33 was not used for the evaluation of Curie temperature $T_c$ in consideration of the influence of leakage at high temperatures. However, when an approximate straight line of the measured data for the coercive voltage value in FIG. 34 was calculated by the least squares method, and the temperature at which the calculated approximate straight line intersected the temperature axis was calculated, and the calculated temperature was evaluated as the Curie temperature $T_c$, the Curie temperature $T_c$ was 587° C. to be an extremely high value.

Consequently, it has been demonstrated that the film structure of Example in which the alignment film 12 has the protrusion portion 12b has a high Curie temperature which is extremely close to the theoretical Curie temperature value of PZT. As a result, according to the film structure of the present embodiment, it has been demonstrated that PZT contained in the piezoelectric film 15 is a single crystal and the piezoelectric properties are thus improved.

While the invention made by the present inventors has been so far specifically described based on the embodiments, the present invention is not limited to the above embodiments, and it goes without saying that various changes can be made without departing from the gist of the present invention.

Within the scope of the concept of the present invention, those skilled in the art can conceive various changes and modifications, and it is understood that these changes and modifications also belong to the scope of the present invention.

For example, additions, deletions, or design changes of components or additions, omissions, or condition changes of steps to the above-described embodiments as appropriate by those skilled in the art are also included in the scope of the present invention as long as they have the gist of the present invention.

REFERENCE SIGNS LIST

10 Film structure
11 Substrate
11a, 12c Upper surface
11b Center
11c Measurement portion
12 Alignment film
12a Film portion
12b Protrusion portion
12d Upper layer portion
12e Lower layer portion
12f Zirconium oxide film
13, 18 Conductive film
13a Platinum film
14 Film
14a SRO film
15, 16, 17 Piezoelectric film
15a, 16a, 17a Lead zirconate titanate film
16g, 17g Crystal grain
17f Film
AR1 Arrow
CP1 Ferroelectric capacitor
CS1, CS2 Compressive stress
EP End point
HT1 Protrusion height
IF1, IF2 Interface
P1 Polarization component
PLU Plane
RG5 Region
SP Start point
TS1 to TS4 Tensile stress

The invention claimed is:

1. A film structure comprising:
a silicon substrate comprising a main surface composed of a (100) plane;
a first zirconium oxide film that is formed on the main surface and that has a cubic crystal structure and is (100)-oriented;
a conductive film that is formed on the first zirconium oxide film and comprises a platinum film which has a cubic crystal structure and is (100)-oriented; and
a first lead zirconate titanate film that is formed on the conductive film and that has a tetragonal crystal structure and is (001)-oriented, wherein
the first zirconium oxide film comprises:
a film portion formed on the main surface, and
a plurality of protrusion portions each protruded from an upper surface of the film portion,
the film portion comprises a second zirconium oxide film which has a cubic crystal structure and is (100)-oriented,
each of the plurality of protrusion portions comprises a third zirconium oxide film which has a cubic crystal structure and is (100)-oriented,
a thickness of the film portion comprising the second zirconium oxide film which has a cubic crystal structure and is (100)-oriented is 11 to 18 nm,
a protrusion height of each of the plurality of protrusion portions protruded from the upper surface of the film portion and comprising the third zirconium oxide film which has a cubic crystal structure and is (100)-oriented is 4 to 8 nm,
a first average interface roughness of a first interface between the first zirconium oxide film and the conductive film is greater than a second average interface roughness of a second interface between the silicon substrate and the first zirconium oxide film,
the first lead zirconate titanate film comprises a composite oxide comprising lead zirconate titanate represented by a formula (Chem. 1) as follows:

$$Pb(Zr_{1-x}Ti_x)O_3 \quad \text{(Chem. 1)}$$

wherein x is 0.32≤x≤0.52, and
x represents Ti/(Ti+Zr), and
a lattice constant ratio of a second lattice constant in a c-axis direction of the lead zirconate titanate to a first lattice constant in an a-axis direction of the lead zirconate titanate is 1.010 to 1.016 when the first lead zirconate titanate film is (001)-oriented, and x, which represents Ti/(Ti+Zr), is 0.32≤x≤0.52.

2. The film structure according to claim 1, wherein
a cross-sectional shape of each one of the plurality of protrusion portions perpendicular to a first direction along the main surface is a triangular shape, and
a width of each one of the plurality of protrusion portions in a second direction that is a direction which is along the main surface and perpendicular to the first direction decreases from a film portion side toward a side opposite to the film portion side.

3. The film structure according to claim 1, wherein
the conductive film covers the plurality of protrusion portions, and
the conductive film is embedded between two adjacent protrusion portions.

4. The film structure according to claim 1, wherein
the first zirconium oxide film is oriented so that a <100> direction of the first zirconium oxide film, which is a direction along the main surface, is parallel to a <100> direction of the silicon substrate, which is a direction along the main surface, and
the platinum film is oriented so that a <100> direction of the platinum film, which is a direction along the main surface, is parallel to the <100> direction of the silicon substrate, which is a direction along the main surface.

5. The film structure according to claim 1, wherein
the first zirconium oxide film is oriented so that a <100> direction of the first zirconium oxide film, which is a direction along the main surface, is parallel to a <100> direction of the silicon substrate, which is a direction along the main surface,
the platinum film is oriented so that a <100> direction of the platinum film, which is a direction along the main surface, is parallel to the <100> direction of the silicon substrate, which is a direction along the main surface, and
the first lead zirconate titanate film is oriented so that a <100> direction of the first lead zirconate titanate film, which is a direction along the main surface, is parallel to the <100> direction of the silicon substrate, which is a direction along the main surface.

6. The film structure according to claim 1, comprising
a second lead zirconate titanate film that is formed on the first lead zirconate titanate film and that has a tetragonal crystal structure and is (001)-oriented, wherein
the first lead zirconate titanate film has a third compressive stress, and
the second lead zirconate titanate film has a fourth tensile stress.

7. The film structure according to claim 1, wherein x is 0.32≤x≤0.48.

8. The film structure according to claim 1, wherein
x is 0.42, and
the lattice constant ratio of the second lattice constant in the c-axis direction of the lead zirconate titanate to the first lattice constant in the a-axis direction of the lead zirconate titanate is 1.016 when the first lead zirconate titanate film is (001)-oriented, and x, which represents Ti/(Ti+Zr), is 0.42.

9. The film structure according to claim 1, wherein
an upper layer portion of the third zirconium oxide film is more stretched and distorted in a horizontal direction as compared with a lower layer portion of the third zirconium oxide film.

10. The film structure according to claim 1, wherein
the conductive film has a first tensile stress, and
the first zirconium oxide film has a first compressive stress or a second tensile stress weaker than the first tensile stress.

11. The film structure according to claim 10, wherein
an upper layer portion of the first zirconium oxide film has a second compressive stress,
a lower layer portion of the first zirconium oxide film has a third tensile stress, the second compressive stress is stronger than the first compressive stress when the first zirconium oxide film has the first compressive stress, and
the third tensile stress is stronger than the second tensile stress when the first zirconium oxide film has the second tensile stress.

12. A method for manufacturing a film structure, comprising the steps of:
(a) preparing a silicon substrate comprising a main surface composed of a (100) plane;
(b) forming a first zirconium oxide film which has a cubic crystal structure and is (100)-oriented on the main surface, wherein the first zirconium oxide film comprises a film portion on the main surface and a plurality of protrusion portions each protruded from an upper surface of the film portion, and
the film portion comprises a second zirconium oxide film which has a cubic crystal structure and is (100)-oriented, and
each of the plurality of protrusion portions comprises a third zirconium oxide film which has a cubic crystal structure and is (100)-oriented,
a thickness of the film portion composed of the second zirconium oxide film which has a cubic crystal structure and is (100)-oriented is 11 to 18 nm,
a protrusion height of each of the plurality of protrusion portions protruded from the upper surface of the film portion and composed of the third zirconium oxide film which has a cubic crystal structure and is (100)-oriented is 4 to 8 nm; and
(c) forming a conductive film comprising a platinum film which has a cubic crystal structure and is (100)-oriented on the first zirconium oxide film and a first lead zirconate titanate film having a tetragonal crystal structure and is (001)-oriented, wherein
a first average interface roughness of a first interface between the first zirconium oxide film and the conductive film is greater than a second average interface roughness of a second interface between the silicon substrate and the first zirconium oxide film,
the first lead zirconate titanate film comprises a composite oxide comprising lead zirconate titanate represented by a formula (Chem. 1) as follows:

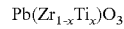  (Chem. 1)

wherein x is 0.32≤x≤0.52, and
x represents Ti/(Ti+Zr), and
a lattice constant ratio of a second lattice constant in a c-axis direction of the lead zirconate titanate to a first lattice constant in an a-axis direction of the lead zirconate titanate is 1.010 to 1.016 when the first lead zirconate titanate film is (001)-oriented, and x, which represents Ti/(Ti+Zr), is 0.32≤x≤0.52.

13. The method for manufacturing a film structure according to claim 12, wherein
a cross-sectional shape of each one of the plurality of protrusion portions perpendicular to a first direction along the main surface is a triangular shape, and
a width of each one of the plurality of protrusion portions in a second direction that is a direction which is along the main surface and perpendicular to the first direction decreases from a film portion side toward a side opposite to the film portion side.

14. The method for manufacturing a film structure according to claim 12, wherein
in the step (c), the conductive film covering the plurality of protrusion portions is formed, and in the step (c), the conductive film is embedded between two adjacent protrusion portions.

15. The method for manufacturing a film structure according to claim 12, wherein
the conductive film has a first tensile stress, and
the first zirconium oxide film has a first compressive stress or a second tensile stress weaker than the first tensile stress.

16. The method for manufacturing a film structure according to claim 12, further comprising the step of:
(d) forming a piezoelectric film comprising a lead zirconate titanate film which has a tetragonal crystal structure and is (001)-oriented on the conductive film.

17. The method for manufacturing a film structure according to claim 12, wherein
the first zirconium oxide film is oriented so that a <100> direction of the first zirconium oxide film, which is a direction along the main surface, is parallel to a <100> direction of the silicon substrate, which is a direction along the main surface, and
the platinum film is oriented so that a <100> direction of the platinum film, which is a direction along the main surface, is parallel to the <100> direction of the silicon substrate, which is a direction along the main surface.

18. The method for manufacturing a film structure according to claim 16, wherein
the first zirconium oxide film is oriented so that a <100> direction of the first zirconium oxide film, which is a direction along the main surface, is parallel to a <100> direction of the silicon substrate, which is a direction along the main surface,
the platinum film is oriented so that a <100> direction of the platinum film, which is a direction along the main surface, is parallel to the <100> direction of the silicon substrate, which is a direction along the main surface, and
the first lead zirconate titanate film is oriented so that a <100> direction of the first lead zirconate titanate film, which is a direction along the main surface, is parallel to the <100> direction of the silicon substrate, which is a direction along the main surface.

* * * * *